(12) United States Patent
Bulovic et al.

(10) Patent No.: US 8,962,073 B2
(45) Date of Patent: Feb. 24, 2015

(54) METHOD AND APPARATUS FOR CONTROLLING FILM DEPOSITION

(71) Applicant: Massachusetts Institute of Technology, Cambridge, MA (US)

(72) Inventors: Vladimir Bulovic, Lexington, MA (US); Jianglong Chen, San Jose, CA (US); Conor F. Madigan, San Francisco, CA (US); Martin A. Schmidt, Reading, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/778,072

(22) Filed: Feb. 26, 2013

(65) Prior Publication Data

US 2014/0063094 A1   Mar. 6, 2014

Related U.S. Application Data

(60) Continuation of application No. 13/080,626, filed on Apr. 5, 2011, now abandoned, which is a continuation of application No. 12/139,404, filed on Jun. 13, 2008, now abandoned, application No. 13/778,072, which is
(Continued)

(51) Int. Cl.
*B05D 1/12* (2006.01)
*B05D 1/26* (2006.01)
(Continued)

(52) U.S. Cl.
CPC ......... *B41J 2/04588* (2013.01); *B05B 17/0638* (2013.01); *B41J 2/14* (2013.01);
(Continued)

(58) Field of Classification Search
USPC .......................................... 427/197, 261, 600
See application file for complete search history.

(56) References Cited

U.S. PATENT DOCUMENTS

| 4,238,807 A | 12/1980 | Bovio et al. |
| 4,751,531 A | 6/1988 | Saito et al. |

(Continued)

FOREIGN PATENT DOCUMENTS

| EP | 1 626 103 | 2/2006 |
| JP | 06-122201 | 5/1994 |

(Continued)

OTHER PUBLICATIONS

C. Ducso, et al. "Porous Silicon Bulk Micromachining for Thermally Isolated Membrane Formation," *Sensors and Actuators A*, 1997, vol. 60, pp. 235-239.

(Continued)

*Primary Examiner* — Frederick Parker

(57) ABSTRACT

The disclosure relates to a method for depositing films on a substrate which may form part of an LED or other types of display. In one embodiment, the disclosure relates to an apparatus for depositing ink on a substrate. The apparatus includes a chamber for receiving ink; a discharge nozzle having an inlet port and an outlet port, the discharge nozzle receiving a quantity of ink from the chamber at the inlet port and dispensing the quantity of ink from the outlet port; and a dispenser for metering the quantity of ink from the chamber to the inlet port of the discharge nozzle; wherein the chamber receives ink in liquid form having a plurality of suspended particles and the quantity of ink is pulsatingly metered from the chamber to the discharge nozzle; and the discharge nozzle evaporates the carrier liquid and deposits the solid particles on the substrate.

9 Claims, 30 Drawing Sheets

Related U.S. Application Data a continuation-in-part of application No. 13/095,619, filed on Apr. 27, 2011, which is a division of application No. 11/282,472, filed on Nov. 21, 2005, now Pat. No. 8,128,753.

(60) Provisional application No. 60/944,000, filed on Jun. 14, 2007, provisional application No. 60/629,312, filed on Nov. 19, 2004.

(51) Int. Cl.
| | |
|---|---|
| B41J 2/045 | (2006.01) |
| B05B 17/00 | (2006.01) |
| B41J 2/14 | (2006.01) |
| B41J 2/07 | (2006.01) |
| H05B 33/10 | (2006.01) |
| H01L 51/00 | (2006.01) |
| H01L 51/56 | (2006.01) |

(52) U.S. Cl.
CPC ............... *B41J 2/07* (2013.01); *H05B 33/10* (2013.01); *B41J 2/04581* (2013.01); *B41J 2202/09* (2013.01); *B41J 2202/16* (2013.01); *H01L 51/0005* (2013.01); *H01L 51/56* (2013.01)
USPC ............................ 427/197; 427/261; 427/600

(56) References Cited

U.S. PATENT DOCUMENTS

| | | |
|---|---|---|
| 5,041,161 A | 8/1991 | Cooke et al. |
| 5,116,148 A | 5/1992 | Ohara et al. |
| 5,155,502 A | 10/1992 | Kimura et al. |
| 5,247,190 A | 9/1993 | Friend et al. |
| 5,405,710 A | 4/1995 | Dodabalapur et al. |
| 5,623,292 A | 4/1997 | Shrivasta |
| 5,703,436 A | 12/1997 | Forrest et al. |
| 5,707,745 A | 1/1998 | Forrest et al. |
| 5,781,210 A | 7/1998 | Hirano et al. |
| 5,834,893 A | 11/1998 | Bulovic et al. |
| 5,844,363 A | 12/1998 | Gu et al. |
| 5,865,860 A | 2/1999 | Delnick |
| 6,013,982 A | 1/2000 | Thompson et al. |
| 6,065,825 A | 5/2000 | Anagnostopoulos et al. |
| 6,086,195 A | 7/2000 | Bohorquez et al. |
| 6,086,196 A | 7/2000 | Ando et al. |
| 6,086,679 A | 7/2000 | Lee et al. |
| 6,087,196 A | 7/2000 | Sturm et al. |
| 6,091,195 A | 7/2000 | Forrest et al. |
| 6,097,147 A | 8/2000 | Baldo et al. |
| 6,257,706 B1 | 7/2001 | Ahn |
| 6,303,238 B1 | 10/2001 | Thompson et al. |
| 6,326,224 B1 | 12/2001 | Xu et al. |
| 6,337,102 B1 | 1/2002 | Forrest et al. |
| 6,468,819 B1 | 10/2002 | Kim et al. |
| 6,498,802 B1 | 12/2002 | Chu et al. |
| 6,548,956 B2 | 4/2003 | Forrest et al. |
| 6,562,405 B2 | 5/2003 | Eser et al. |
| 6,576,134 B1 | 6/2003 | Agner |
| 6,586,763 B2 | 7/2003 | Marks et al. |
| 6,601,936 B2 | 8/2003 | McDonald |
| 6,666,548 B1 | 12/2003 | Sadasivan et al. |
| 6,811,896 B2 | 11/2004 | Aziz et al. |
| 6,824,262 B2 | 11/2004 | Kubota et al. |
| 6,861,800 B2 | 3/2005 | Tyan et al. |
| 6,896,346 B2 | 5/2005 | Trauernicht et al. |
| 6,911,671 B2 | 6/2005 | Marcus et al. |
| 6,917,159 B2 | 7/2005 | Tyan et al. |
| 6,982,005 B2 | 1/2006 | Eser et al. |
| 7,023,013 B2 | 4/2006 | Ricks et al. |
| 7,247,394 B2 | 7/2007 | Hatwar et al. |
| 7,374,984 B2 | 5/2008 | Hoffman |
| 7,404,862 B2 | 7/2008 | Shtein et al. |
| 7,431,435 B2 | 10/2008 | Lopez et al. |
| 7,431,968 B1 | 10/2008 | Shtein et al. |
| 7,530,778 B2 | 5/2009 | Yassour et al. |
| 7,603,028 B2 | 10/2009 | Yassour et al. |
| 7,604,439 B2 | 10/2009 | Yassour et al. |
| 7,802,537 B2 | 9/2010 | Kang et al. |
| 7,857,121 B2 | 12/2010 | Yassour |
| 7,883,832 B2 | 2/2011 | Colburn et al. |
| 7,908,885 B2 | 3/2011 | Devitt |
| 8,128,753 B2 | 3/2012 | Bulovic et al. |
| 2001/0045973 A1 | 11/2001 | Sharma et al. |
| 2002/0008732 A1 | 1/2002 | Moon et al. |
| 2002/0191063 A1 | 12/2002 | Gelbart et al. |
| 2003/0000476 A1 | 1/2003 | Matsunaga et al. |
| 2003/0175414 A1 | 9/2003 | Hayashi |
| 2003/0230980 A1 | 12/2003 | Forrest et al. |
| 2004/0009304 A1 | 1/2004 | Pichler |
| 2004/0048000 A1 | 3/2004 | Shtein et al. |
| 2004/0048183 A1 | 3/2004 | Teshima |
| 2004/0056244 A1 | 3/2004 | Marcus et al. |
| 2004/0086631 A1 | 5/2004 | Han |
| 2004/0174116 A1 | 9/2004 | Lu et al. |
| 2004/0202794 A1 | 10/2004 | Yoshida |
| 2005/0005850 A1 | 1/2005 | Yamazaki et al. |
| 2005/0190220 A1 | 9/2005 | Lim et al. |
| 2005/0223994 A1 | 10/2005 | Blomlelly et al. |
| 2005/0255249 A1 | 11/2005 | Schlatterbeck |
| 2006/0012290 A1 | 1/2006 | Kang |
| 2006/0115585 A1 | 6/2006 | Bulovic et al. |
| 2007/0040877 A1 | 2/2007 | Kachi |
| 2007/0058010 A1 | 3/2007 | Nagashima |
| 2007/0098891 A1 | 5/2007 | Tyan et al. |
| 2007/0134512 A1 | 6/2007 | Klubek et al. |
| 2007/0286944 A1 | 12/2007 | Yokoyama et al. |
| 2008/0174235 A1 | 7/2008 | Kim et al. |
| 2008/0238310 A1 | 10/2008 | Forrest et al. |
| 2008/0299311 A1 | 12/2008 | Shtein et al. |
| 2008/0308037 A1 | 12/2008 | Bulovic et al. |
| 2008/0311289 A1 | 12/2008 | Bulovic et al. |
| 2008/0311296 A1 | 12/2008 | Shtein et al. |
| 2008/0311307 A1 | 12/2008 | Bulovic et al. |
| 2009/0031579 A1 | 2/2009 | Piatt et al. |
| 2009/0045739 A1 | 2/2009 | Kho et al. |
| 2009/0115706 A1 | 5/2009 | Hwang et al. |
| 2009/0167162 A1 | 7/2009 | Lin et al. |
| 2009/0220680 A1 | 9/2009 | Winters |
| 2010/0055810 A1 | 3/2010 | Sung et al. |
| 2010/0171780 A1 | 7/2010 | Madigan et al. |
| 2010/0188457 A1 | 7/2010 | Madigan et al. |
| 2010/0201749 A1 | 8/2010 | Somekh et al. |
| 2010/0310424 A1 | 12/2010 | Rose et al. |
| 2011/0008541 A1 | 1/2011 | Madigan et al. |
| 2011/0057171 A1 | 3/2011 | Adamovich et al. |
| 2011/0267390 A1 | 11/2011 | Bulovic et al. |
| 2011/0293818 A1 | 12/2011 | Madigan et al. |

FOREIGN PATENT DOCUMENTS

| | | |
|---|---|---|
| JP | 08-216401 | 8/1996 |
| JP | 09-248918 | 9/1997 |
| JP | 2002-069650 | 3/2002 |
| JP | 2005-286069 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 05-255630 | 10/2009 |
| KR | 100232852 | 12/1999 |
| KR | 10-2008-0060111 | 7/2001 |
| WO | WO 2005/090085 | 9/2005 |

OTHER PUBLICATIONS

C. Tsamis, et al. "Thermal Properties of Suspended Porous Microhotplates for Sensor Applications," *Sensor and Actuators B*, 2003, vol. 95, pp. 78-82.

(56) References Cited

OTHER PUBLICATIONS

Chin, Byung Doo, "Effective Hole Transport Layer Structure for Top Emitting Devices Based on Laser Transfer Patterning," *Journal of Physics D: Applied Physics*, 2007, vol. 40, pp. 5541-5546.

Elwenspoek et al., "Silicon Micromachining," Aug. 2004, Cambridge University, Cambridge, U.K. ISBN 0521607671.

G.S. Chung, "Fabrication and Characterization of Micro-heaters with Low-power Consumption using SOI membrane and Trench Structures," *Sensors and Actuators A*, 2004, vol. 112, pp. 55-60.

J.C. Belmonte, et al. "High-temperature Low-power Performing Micromachined Suspended Micro-hotplate for Gas Sensing Applications" *Sensors and Actuators B*, 2006, vol. 114, pp. 826-835.

J. Lee, et al. "Differential Scanning Calorimeter Based on Suspended Membrane Single Crystal Silicon Microhotplate," *Journal of Microelectromechanical Systems*, Dec. 2008, vol. 17, No. 6, pp. 1513-1525.

J. Lee, et al. "Cavity Effects on Light Extraction in Organic Light emitting Devices," Applied Physics Letters, Jan. 24, 2008, vol. 92, No. 3, 5 pages.

Geffroy et al., "Organic Light-emitting Diode (OLED) Technology: Material Devices and Display Technologies," Polymer International, Jun. 2006, vol. 55, pp. 572-582. (Abstract only).

Huang et al., "Reducing Blueshift of Viewing Angle for Top-Eimtting Organic Light-Emitting Devices," Dec. 6, 2008, 3 pages.

National Institute of Industrial Research (NIIR), Handbook on Printing Technology (Offset, Gravure, flexo, Screen) 2nd edition, 2011, ISBN 97881782330877.

Lee et al., "Microcavity Effect of Top-emission of Organic Light-emitting Diodes Using Aluminum Cathode and Anode," The Bulletin of the Korean Chemical Society, 2005, vol. 26, No. 9, pp. 1344-1346.

S.H. Kim et al. "Fabrication and Characterization of Co-planar type MEMS structures on SiO2/Si3N4 membrane for Gas Sensors with Dispensing Method Guided by Micromachined Wells," Journal of Electroceramics, 2006, vol. 17, pp. 995-998. (Abstract).

Street et al., "Jet Printing of Active-Matrix TFT Backplanes for Displays and Sensors", *IS&T Archiving*, Dec. 2005, vol. 20, No. 5, 16 pages.

Forrest, Stephen R., "The Path to Ubiquitous and Low-cost Organic Electronic Appliances on Plastic," *Nature*, Apr. 29, 2004, vol. 428, 8 pages.

Leblanc et al., "Micromachined Printheads for the Evaporative Patterning of Organic Materials and Metals," *Journal of Microelectromechanical Systems*, Apr. 2007, vol. 16, No. 2, 7 pages.

Lindermann et al., "Thermal Bubble Jet Printhead with Integrated Nozzle Plate," *NIP20: International Conference on Digital Printing Technologies*, Oct. 2004, p. 834-839.

Chen, Jianglong, "Novel Patterning Techniques for Manufacturing Organic and Nanostructured Electronics," *M.S. Materials Science and Engineering*, Massachusetts Institute of Technology, 2003, pp. 1-206.

Chen, Jingkuang et al., "A High-Resolution Silicon Monolithic Nozzle Array for Inkjet Printing," *IEEE Transactions on Electron Devices*, vol. 44, No. 9, Sep. 1997, pp. 1401-1409.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.

International Preliminary Report on Patentability issued on Dec. 17, 2009 for PCT Application No. PCT/US08/66975.

EP Examination Report dated Jul. 30, 2010 issued for EP Patent Application 08771068.7.

CN Office Action dated Oct. 12, 2010 issued for CN Patent Application 200880020197.8.

EP Examination Report dated Jul. 13, 2010 issued for EP Patent Application 08771094.3.

CN Office Action dated Dec. 17, 2010 issued for CN Patent Application 200880020151.6.

EP Examination Report dated Jul. 13, 2010 issued for EP Patent Application 08771084.4.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

Huang et al., "Reducing Blueshift of Viewing Angle for Top-Emitting Organic Light-Emitting Devices," Dec. 6, 2008, 3 pages.

S.H. Kim et al. "Fabrication and Characterization of co-planar type MEMS Structures on SiO2/Si3N4 Membrane for Gas Sensors with Dispensing Method Guided by Micromachined Wells," Journal of Electroceramics, 2006, vol. 17, No. 2-4, pp. 995-998.

US Non-Final Office Action issued for U.S. Appl. No. 11/282,472 on Sep. 16, 2009.

US Final Office Action issued for U.S. Appl. No. 11/282,472 on Jan. 16, 2010.

US Non-Final Office Action issued for U.S. Appl. No. 11/282,472 on Nov. 18, 2010.

CN Office Action dated Jan. 12, 2011 issued for CN Patent Application 200880019990.6.

US Non-Final Office Action issued for U.S. Appl. No. 12/139,391 on Jun. 7, 2011.

Chen et al., "Evaporative Deposition of Molecular Organics in Ambient with a Molecular Jet Printer," Digital Fabrication, Sep. 2006, pp. 63-65. (Abstract only).

Chen et al., "Ambient Environment Patterning of Organic Thin Films by a Second Generation Molecular Jet (MoJet) Printer," Progress Report 2006-2007, Oct. 2007, Chapter 26, pp. 6-7.

US 8,962,073 B2

METHOD AND APPARATUS FOR CONTROLLING FILM DEPOSITION

This invention was made with government support under grant number DMR0213282 awarded by the National Science Foundation. The government has certain rights in this invention.

CROSS-REFERENCE TO RELATED APPLICATIONS

The instant application is a continuation of U.S. application Ser. No. 13/080,626, filed Apr. 5, 2011, abandoned which is a continuation of U.S. application Ser. No. 12/139,404, filed Jun. 13, 2008, abandoned which claims priority to Provisional Application No. 60/944,000, filed Jun. 14, 2007; the instant application is a CIP of application Ser. No. 13/095,619, filed Apr. 27, 2011, which is a DIV of application Ser. No. 11/282,472, filed Nov. 21, 2005 (now U.S. Pat. No. 8,128,753) which claimed priority to Provisional Application No. 60/629,312, Filed Nov. 19, 2004. The specification of all recited applications are incorporated herein in their entirety.

BACKGROUND

1. Field of the Invention

The disclosure relates to a method and apparatus for efficiently depositing patterns of films on a substrate. More specifically, the disclosure relates to a method and apparatus for depositing films on a substrate which may form part of an LED or other types of display.

2. Description of the Related Art

The manufacture of organic light emitting devices (OLEDs) requires depositing one or more organic films on a substrate and coupling the top and bottom of the film stack to electrodes. The film thickness is a prime consideration. The total layer stack thickness is about 100 nm and each layer is optimally deposited uniformly with an accuracy of better than +/−1 nm. Film purity is also important. Conventional apparatuses form the film stack using one of two methods: (1) thermal evaporation of organic material in a relative vacuum environment and subsequent condensation of the organic vapor on the substrate; or, (2) dissolution of organic material into a solvent, coating the substrate with the resulting solution, and subsequent removal of the solvent.

Another consideration in depositing the organic thin films of an OLED is placing the films precisely at the desired location. There are two conventional technologies for performing this task, depending on the method of film deposition. For thermal evaporation, shadow masking is used to form OLED films of a desired configuration. Shadow masking techniques require placing a well-defined mask over a region of the substrate followed by depositing the film over the entire substrate area. Once deposition is complete, the shadow mask is removed. The regions exposed through the mask define the pattern of material deposited on the substrate. This process is inefficient, as the entire substrate must be coated, even though only the regions exposed through the shadow mask require a film. Furthermore, the shadow mask becomes increasingly coated with each use, and must eventually be discarded or cleaned. Finally, the use of shadow masks over large areas is made difficult by the need to use very thin masks (to achieve small feature sizes) that make said masks structurally unstable. However, the vapor deposition technique yields OLED films with high uniformity and purity and excellent thickness control.

For solvent deposition, ink jet printing can be used to deposit patterns of OLED films. Ink jet printing requires dissolving organic material into a solvent that yields a printable ink. Furthermore, ink jet printing is conventionally limited to the use of single layer OLED film stacks, which typically have lower performance as compared to multilayer stacks. The single-layer limitation arises because printing typically causes destructive dissolution of any underlying organic layers. Finally, unless the substrate is first prepared to define the regions into which the ink is to be deposited, a step that increases the cost and complexity of the process, ink jet printing is limited to circular deposited areas with poor thickness uniformity as compared to vapor deposited films. The material quality is also typically lower, due to structural changes in the material that occur during the drying process and due to material impurities present in the ink. However, the ink jet printing technique is capable of providing patterns of OLED films over very large areas with good material efficiency.

No conventional technique combines the large area patterning capabilities of ink jet printing with the high uniformity, purity, and thickness control achieved with vapor deposition for organic thin films. Because ink jet processed single layer OLED devices continue to have inadequate quality for widespread commercialization, and thermal evaporation remains impractical for scaling to large areas, it is a major technological challenge for the OLED industry to develop a technique that can offer both high film quality and cost-effective large area scalability.

Finally, manufacturing OLED displays may also require the patterned deposition of thin films of metals, inorganic semiconductors, and/or inorganic insulators. Conventionally, vapor deposition and/or sputtering have been used to deposit these layers. Patterning is accomplished using prior substrate preparation (e.g., patterned coating with an insulator), shadow masking as described above, and when a fresh substrate or protective layers are employed, conventional photolithography. Each of these approaches is inefficient as compared to the direct deposition of the desired pattern, either because it wastes material or requires additional processing steps. Thus, there is a need for these materials as well for a method and apparatus for depositing high-quality, cost effective, large area scalable films.

SUMMARY OF THE INVENTION

In one embodiment, the disclosure is directed to an apparatus for depositing ink on a substrate, the apparatus comprising: a chamber for receiving ink; a discharge nozzle having an inlet port and an outlet port, the discharge nozzle receiving a quantity of ink from the chamber at the inlet port and dispensing the quantity of ink from the outlet port; and a dispenser for metering the quantity of ink from the chamber to the inlet port of the discharge nozzle; wherein the chamber receives ink in liquid form having a plurality of suspended particles and the quantity of ink is pulsatingly metered from the chamber to the discharge nozzle; and the discharge nozzle evaporates the carrier liquid and deposits the substantially solid particles on the substrate.

In another embodiment, the disclosure relates to a method for depositing ink on a substrate, the method comprising: using a pulsating energy having a first frequency to meter a quantity of ink to a discharge nozzle, the ink defined by a plurality of solid particles in a carrier liquid; receiving the metered quantity of ink at the discharge nozzle and evaporating the carrier liquid from the metered quantity of ink to provide a quantity of substantially solid ink particles; dispensing the substantially solid ink particles from the discharge nozzle and depositing the substantially solid particles on the substrate; and wherein at least a portion of the substantially solid ink particles are converted to a vapor phase during discharge from the discharge nozzle, directed to the substrate as a vapor, and condense on a surface of the substrate in substantially solid form.

In still another embodiment, the disclosure relates to a method for depositing ink on a substrate, the method comprising: providing liquid ink to a chamber, the liquid ink defined by a plurality of suspended particles in a carrier liquid; pulsatingly energizing a dispenser to meter a quantity of liquid ink from the chamber to a discharge nozzle, the quantity of liquid ink metered as a function of a frequency of at least one of a pulse amplitude, a pulse duration or a pulse frequency; receiving the metered quantity of ink at a discharge nozzle, the discharge nozzle having a plurality of conduits for directing the metered quantity of ink; heating the metered quantity of ink at the plurality of conduits to evaporate the carrier liquid; and discharging the plurality of suspended particles from the discharge nozzle onto the substrate; wherein the plurality of suspended particles are deposited on the substrate in substantially solid form.

In still another embodiment, the disclosure relates to a system for depositing ink on a substrate, the system comprising: a chamber having a quantity of ink, the ink defined by a plurality of suspended ink particles in a carrier liquid; a discharge nozzle proximal to the chamber for receiving a metered quantity of ink pulsatingly delivered from the chamber by a dispenser, the discharge nozzle evaporating the carrier liquid to form a substantially solid quantity of ink particles; and a controller in communication with the discharge nozzle, the controller energizing the discharge nozzle to communicate the substantially solid quantity of ink particles from the discharge nozzle onto the substrate.

In still another embodiment, the disclosure relates to a system for depositing ink on a substrate, the system comprising: a chamber for receiving a quantity of ink, the ink having a plurality of suspended particles in a carrier liquid; an ink dispenser for pulsatingly metering a quantity of ink delivered from the chamber; a discharge nozzle for receiving a metered quantity of ink delivered from the chamber and evaporating the carrier liquid from the received quantity of ink to form a substantially solid quantity of particles; a first controller in communication with the ink dispenser, the first controller pulsatingly energizing the dispenser to meter a quantity of ink delivered from the chamber; and a second controller in communication with the discharge nozzle, the second controller energizing the discharge nozzle to communicate the metered quantity of particles from the discharge nozzle onto the substrate.

In still another embodiment, the disclosure relates to a method for providing accurate deposition of ink on a substrate, the method comprising: providing a quantity of ink to a chamber, the ink having a plurality of suspended particles in a carrier liquid; metering at least a portion of the ink delivered from the chamber to an inlet of a discharge nozzle by activating a dispenser; receiving the metered ink at a discharge nozzle, the discharge nozzle having an inlet port and an outlet port; transporting the metered ink from the inlet port to the outlet port of the discharge nozzle forming substantially solid particles; and depositing the substantially solid particles from the outlet port of the discharge nozzle onto a substrate by energizing the discharge nozzle to pulsatingly eject at least a portion of the substantially solid particles onto the substrate.

In still another embodiment, the disclosure relates to a system for accurate deposition of ink on a substrate, the system comprising: a storage means for storing a composition of ink particles in a carrier liquid; a metering means in communication with the storage means to pulsatingly meter at least a portion of the composition; a transporting means for transporting the ink from the chamber to a discharge nozzle; an evaporating means for evaporating the carrier liquid to form a substantially solid quantity of ink particles at the discharge nozzle; and a discharging means for discharging the substantially solid ink particles from the discharge nozzle onto a substrate.

In still another embodiment, the disclosure relates to an apparatus for depositing particles on a substrate, the apparatus comprising: a chamber for receiving ink, the chamber receiving ink in liquid form having a plurality of particles in a carrier liquid; a dispenser associated with the chamber, the dispenser metering a quantity of ink delivered from the chamber to a discharge nozzle, the discharge nozzle evaporating the carrier liquid to form a substantially solid quantity of ink particles; wherein the discharge nozzle rotates axially relative to the chamber to discharge the substantially solid quantity of ink particles; and wherein the discharge nozzles deposits the substantially solid particles onto a substrate.

In still another embodiment, the disclosure relates to a system for controlling a printing device, the system comprising: a first controller having a first processor circuit in communication with a first memory circuit, the first memory circuit containing instructions for directing the first processor to: identify a plurality of chambers, each chamber receiving liquid ink having a plurality of dissolved or suspended particles in a carrier liquid, engage each of the plurality of chambers to meter a quantity of liquid ink for dispensing; a second controller having a second processor circuit in communication with a second memory circuit, the second memory circuit containing instructions for directing the second processor to: identify a plurality of discharge nozzles, each of the plurality of discharge nozzles receiving the quantity of liquid from a corresponding one of the plurality of chambers, activate each of the plurality of the discharge nozzles to evaporate at least a part of the carrier liquid, direct each of the plurality of discharge nozzles to deposit substantially solid ink particles onto a substrate.

BRIEF DESCRIPTION OF THE DRAWINGS

These and other embodiments of the disclosure will be discussed with reference to the following non-limiting and exemplary illustrations, in which like elements are numbered similarly, and where.

DETAILED DESCRIPTION

In one embodiment, the disclosure relates to a method and apparatus for depositing a film in substantially solid form on a substrate. Such films can be used, for example, in the design and construction of OLEDs and large area transistor circuits. In one embodiment, the disclosure relates to a method and apparatus for depositing a film of material in substantially solid form on a substrate. In another embodiment, the disclosure relates to a method and apparatus for depositing a film of material substantially free of solvent of a substrate. Such films can be used, for example, in the design and construction of OLEDs and large area transistor circuits. The materials that may be deposited by the apparatuses and methods described herein include organic materials, metal materials, and inorganic semiconductors and insulators, such as inorganic oxides, chalcogenides, Group IV semiconductors, Group III-V compound semiconductors, and Group II-VI semiconductors.

Figure 1A:
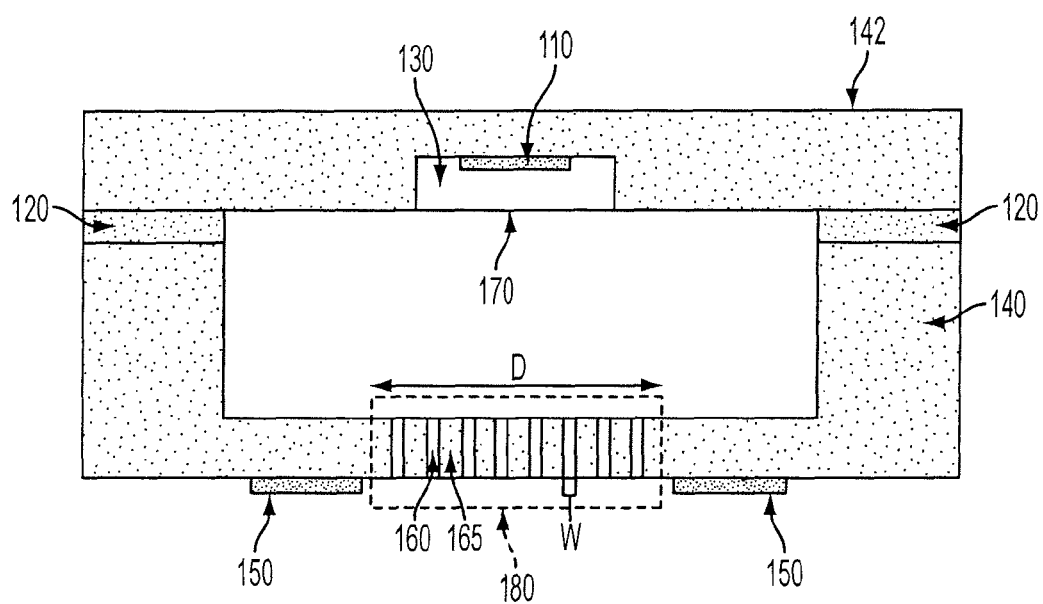
FIG. 1A is a schematic representation of an exemplary print-head having a thermal ink dispensing mechanism according to one embodiment of the disclosure.

FIG. 1A is a schematic representation of an apparatus for depositing material according to one embodiment of the disclosure. Namely, FIG. 1A provides a schematic representation of a thermal jet print-head according to one embodiment of the disclosure.

Referring to FIG. 1A, the exemplary apparatus for depositing a material on a substrate comprises chamber 130, orifice 170, nozzle 180, and micro-porous conduits 160. Chamber 130 receives ink in liquid form and communicates the ink from orifice 170 to discharge nozzle 180. The ink can comprise suspended or dissolved particles in a carrier liquid. These particles can comprise single molecules or atoms, or aggregations of molecules and/or atoms. The path between orifice 170 and discharge chamber 180 defines a delivery path. In the embodiment of FIG. 1A, discharge nozzle 180 comprises conduits 160 separated by partitions 165. Conduits 160 may include micro-porous material therein. A surface of discharge nozzle 180 proximal to orifice 170 defines the inlet port to discharge nozzle 180 while the distal surface of discharge nozzle 180 defines the outlet port. A substrate (not shown) can be positioned proximal to the outlet port of discharge nozzle 180 for receiving ink deposited from the nozzle.

The thermal jet print-head of FIG. 1 further includes bottom structure 140, which receives discharge nozzle 180. Discharge nozzle 180 can be fabricated as part of the bottom structure 140. Alternatively, discharge nozzle 180 can be manufactured separately and later combined with bottom structure 140 to form an integrated structure. Top structure 142 receives chamber 130. Top structure 142 can be formed with appropriate cavities and conduits to form chamber 130. Top structure 142 and bottom structure 140 are coupled through bonds 120 to form a housing. The housing allows the thermal jet print-head to operate under pressure or in vacuum. The housing may further comprise an inlet port (not shown) for accepting a transport gas for carrying the material from the discharge nozzle to the substrate (not shown). Alternatively, a port (not shown) can be integrated into top structure 142 to receive transport gases. The port can include a flange adapted to receive a transport gas, which according to one embodiment comprises a substantially inert mixture of one or more gases. The mixture can include gases which are substantially non-reactive with the materials being deposited by the apparatus, such as nitrogen or argon when used with typical organic materials. The transport gas can transport particles from discharge nozzle 180 by flowing through micro-pores 160.

A heater 110 can be added optionally to chamber 130 for heating and/or dispensing the ink. In FIG. 1A, heater 110 is positioned inside chamber 130. Heater 110 can be any thermal energy source coupled to chamber 130 for providing pulsating energy to the liquid ink and thereby discharge a droplet of the liquid ink through orifice 170. In one embodiment, heater 110 delivers heat in pulses having a duration of one minute or less. For instance, the heater can be energized with square pulses having a variable duty cycle and a cycle frequency of 1 kHz. Thus, the heater energy can be used to meter the quantity of ink delivered from chamber 130 to discharge nozzle 180. Chamber 130 may also contain material, other than ink, required for forming a film used in the fabrication of an OLED or transistor. Orifice 170 can be configured such that surface tension of the liquid in chamber 130 prevents discharge of the liquid prior to activation of the mechanism for dispensing the ink.

In the embodiment of FIG. 1A, discharge nozzle 180 includes partitions (or rigid portions) 165 separated by conduits 160. Conduits 160 and rigid portions 165 can collectively define a micro porous environment. The micro-porous environment can be composed of a variety of materials, including, micro-porous alumina or solid membranes of silicon or silicon carbide and having micro-fabricated pores. Micro-pores 160 prevent the material dissolved or suspended in the liquid from escaping through discharge nozzle 180 until the medium is appropriately activated. When the discharged droplet of liquid encounters discharge nozzle 180, the liquid is drawn into micro-pores 160 with assistance from capillary action. The liquid in the ink may evaporate prior to activation of discharge nozzle 180, leaving behind a coating of the suspended or dissolved particles on the micro-pore walls. The liquid in the ink may comprise one or more solvents with a relatively-low vapor pressure. The liquid in the ink may also comprise one or move solvents with a relatively-high vapor pressure.

The evaporation of the liquid in the ink may be accelerated by heating the discharge nozzle. The evaporated liquid can be removed from the chamber and subsequently collected (not shown), for instance, by flowing gas over one or more of the discharge nozzle faces. Depending on the desired application, micro-pores 160 can provide conduits (or passages) having a maximum linear cross-sectional distance W of a few nanometers to hundreds of microns. The micro-porous region comprising discharge nozzle 180 will take a different a shape and cover a different area depending on the desired application, with a typical maximum linear cross-sectional dimension D ranging from a few hundred nanometers to tens of millimeters. In one embodiment, the ratio of W/D is in a range of about 1/10 to about 1/1000.

In the exemplary apparatus of FIG. 1A, discharge nozzle 180 is actuated by nozzle heater 150. Nozzle heater 150 is positioned proximal to discharge nozzle 180. Nozzle heater 150 may comprise a thin metal film. The thin metal film can be comprised of, for example, platinum. When activated, nozzle heater 150 provides pulsating thermal energy to discharge nozzle 180, which acts to dislodge the material contained within micro-pores or conduits 160, which can subsequently flow out from the discharge nozzle. In one embodiment, the pulsations can be variable on a time scale of one minute or less.

Dislodging the ink particles may include vaporization, either through sublimation or melting and subsequent boiling. It should be noted again that the term particles is used generally, and includes anything from a single molecule or atom to a cluster of molecules or atoms. In general, one can employ any energy source coupled to the discharge nozzle that is capable of energizing discharge nozzle 180 and thereby discharging the material from micro-pores 160; for instance, mechanical (e.g., vibrational). In one embodiment of the disclosure, a piezoelectric material is used instead of, or in addition to, nozzle heaters 150.

Figure 1B:
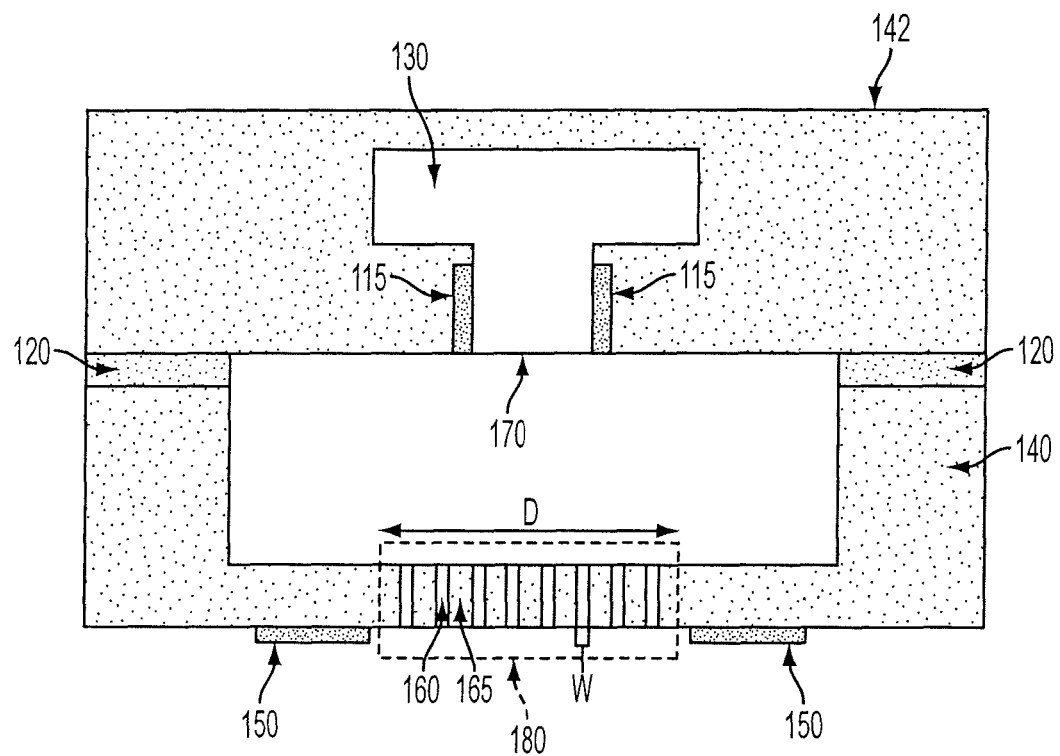
FIG. 1B is a schematic representation of an exemplary print-head having a piezoelectric ink dispensing mechanism according to one embodiment of the disclosure.

FIG. 1B is a schematic representation of an apparatus for depositing a film according to one embodiment of the disclosure. Referring to FIG. 1B, the exemplary apparatus for depositing a material on a substrate is similar to the embodiment of FIG. 1A, except chamber 130 is shaped differently, and the ink is dispensed by pulsatingly activating piezoelectric element 115. When activated, piezoelectric elements 115 pulsate to discharge a droplet of the liquid contained within chamber 130 through orifice 170 toward discharge nozzle 180. Thus, chamber heater 110 can be replaced by piezoelectric elements 115. While not shown in FIG. 1B, the piezoelectric elements can be used in addition to or in combination with a chamber heater.

Figure 1C:
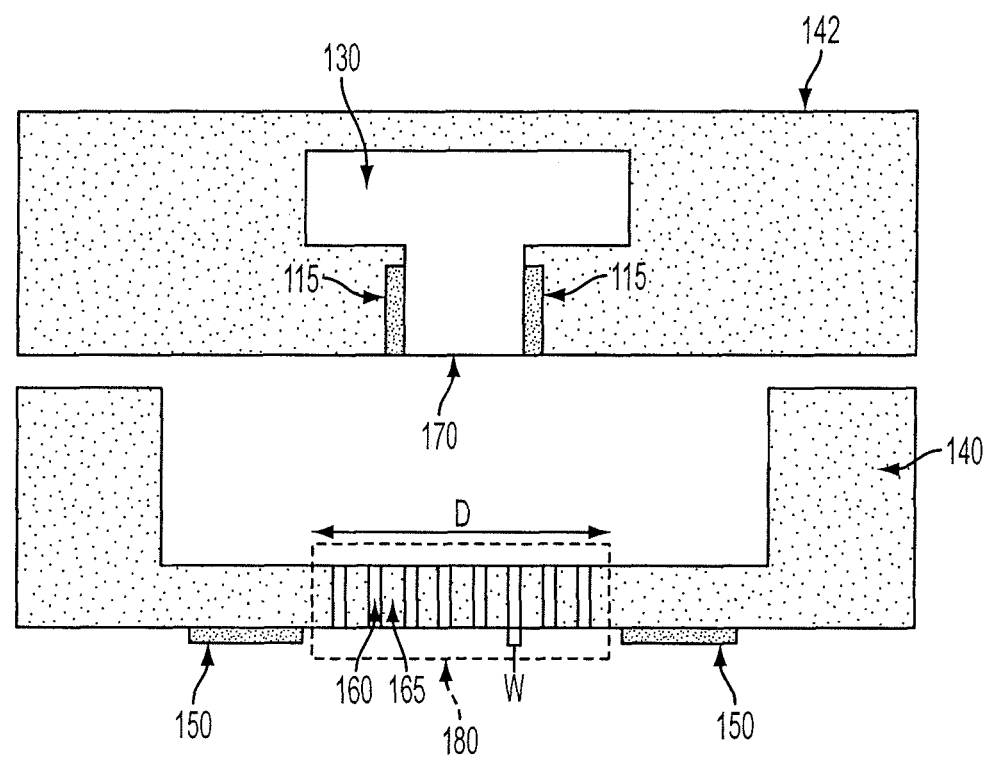
FIG. 1C is a schematic representation of an exemplary print-head having physically separated chamber housing and discharge nozzle housing portions according to one embodiment of the disclosure.

FIG. 1C is a schematic representation of an apparatus for depositing a film according to another embodiment of the disclosure. Referring to FIG. 1C, the exemplary apparatus for depositing a material on a substrate comprises similar elements as in FIG. 1B except bonds 120 are removed to illustrate that top structure 142 and bottom structure 140 can be structurally distinct components. In the configuration of FIG. 1C, top structure 142 and bottom structure 140 may be accessed and positioned independently, as may be desirable when performing maintenance on the apparatus.

Figure 1D:
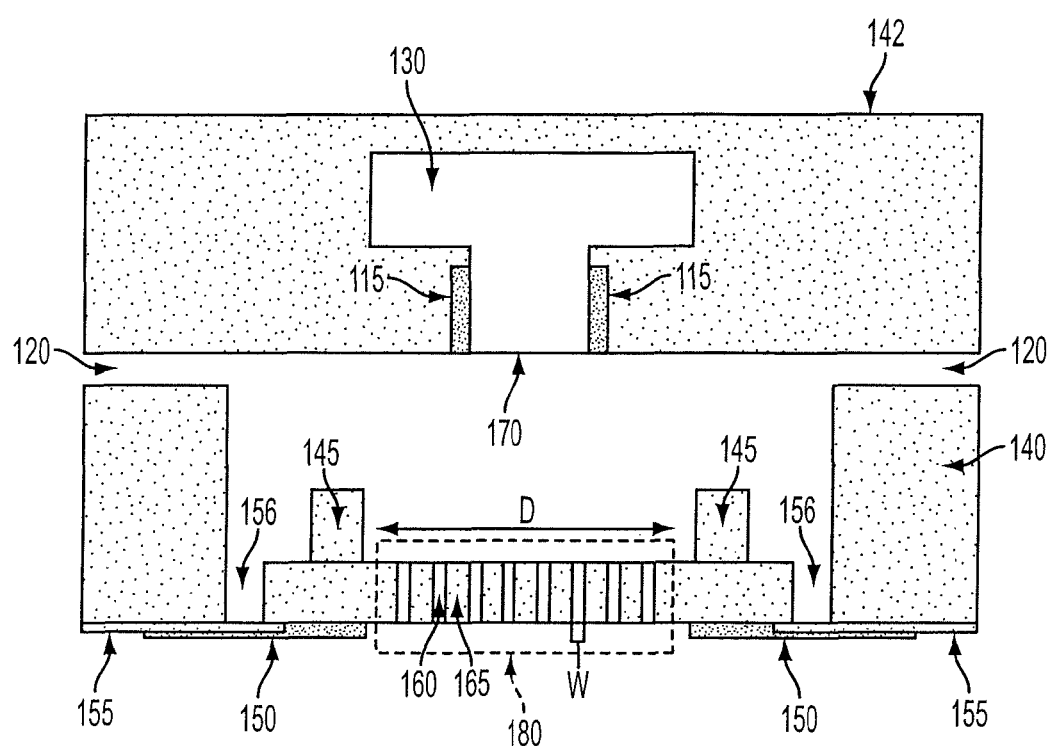
FIG. 1D is a schematic representation of an exemplary print-head having physically separated chamber housing and discharge nozzle housing portions, and isolation space between the discharge nozzle and the associated housing, according to one embodiment of the disclosure.

FIG. 1D is a schematic representation of an apparatus for depositing a film according to still another embodiment of the disclosure. The exemplary apparatus of FIG. 1D comprises similar elements as the apparatus of FIG. 1C except confining well 145 is introduced. This structure mechanically confines ink, or any other material, supplied to discharge nozzle 180 from ink chamber 130 through chamber orifice 170. This structure can enhance the uniformity of the loading of ink into micro-pores 160 and can correct for positioning errors in the placement of ink material supplied to discharge nozzle 180 from ink chamber 130.

Another distinction in the embodiment of FIG. 1D is the presence of connective regions 155. In each of FIGS. 1A to 1C, discharge nozzle 180 was shown as integrated with the bottom structure 140. In contrast, discharge nozzle 180 of FIG. 1D is manufactured to achieve a physically distinct bottom structure 140 and discharge nozzle 180 with connective regions 155 comprising a different material. Regions 155 are used to connect discharge nozzle 180 to bottom structure 140. Connective regions 155 extend beyond bottom structure 140 to leave opening 156. Opening 156 can be adjusted depending on the size of the housing and the objectives in physically separating 180 from 140. For instance, this configuration can provide improved thermal isolation of discharge nozzle 180 from the surrounding structure. FIG. 1D also shows heater 150 extending beneath brackets 155 to reach discharge nozzle 180. It should be noted that heater 150 can be replaced augmented by or replaced with a piezoelectric element or other electromechanical means for delivering pulsating energy.

Figure 1E:
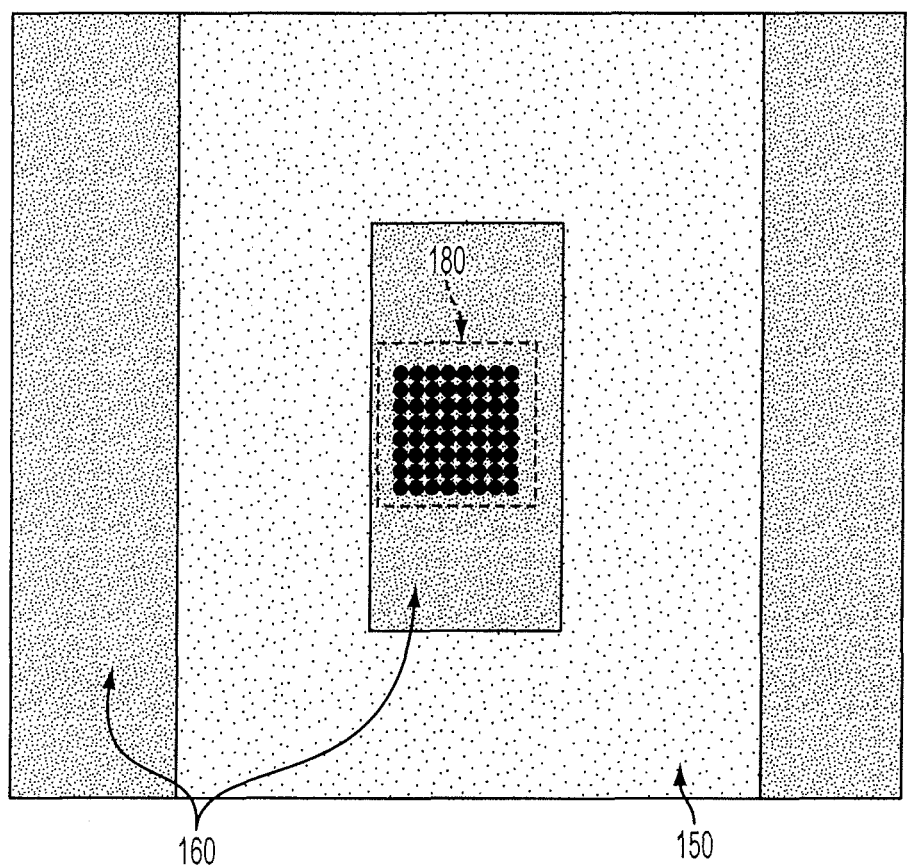
FIG. 1E shows a top view of an exemplary implementation of the discharge nozzle.

FIG. 1E is an image of a discharge nozzle 180, as part of an apparatus for depositing a film on a substrate. In FIG. 1E, discharge nozzle heater 150 is comprised of a thin platinum film on a silicon housing 140. In the center of discharge nozzle 180 are also shown discharge nozzle micro-pores corresponding to micro-pores 160 indicated in prior figures.

Figure 2A:
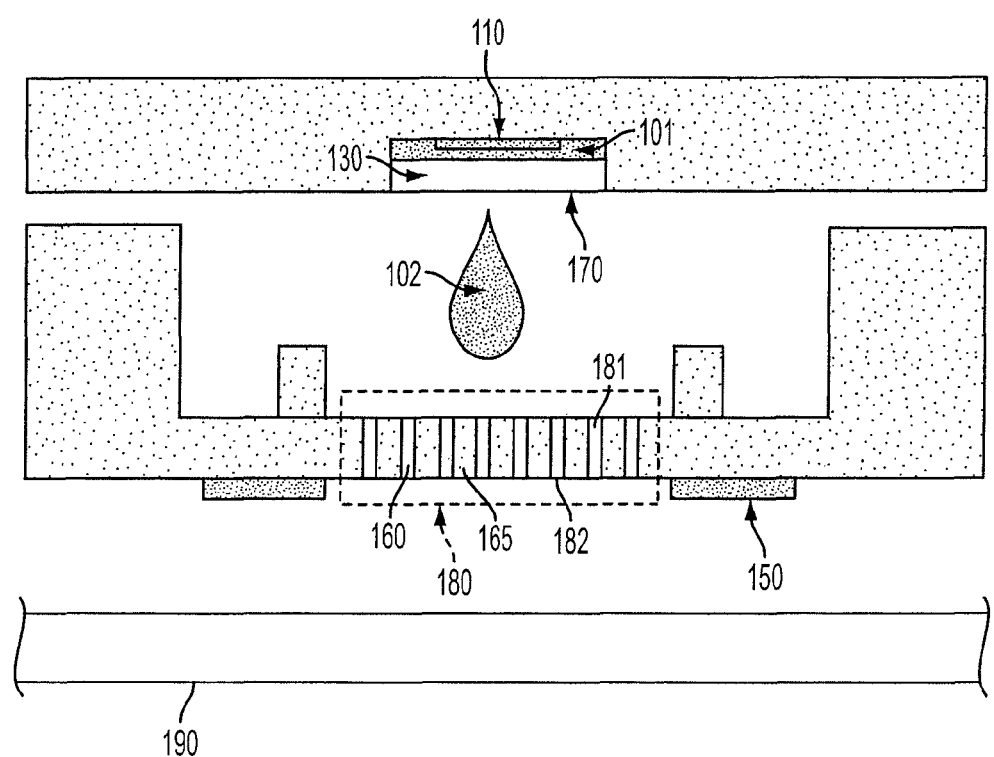
FIGS. 2A-2D schematically illustrate the process of depositing a solvent-free material using a print-head apparatus according to an embodiment of the disclosure.
Figure 2B:
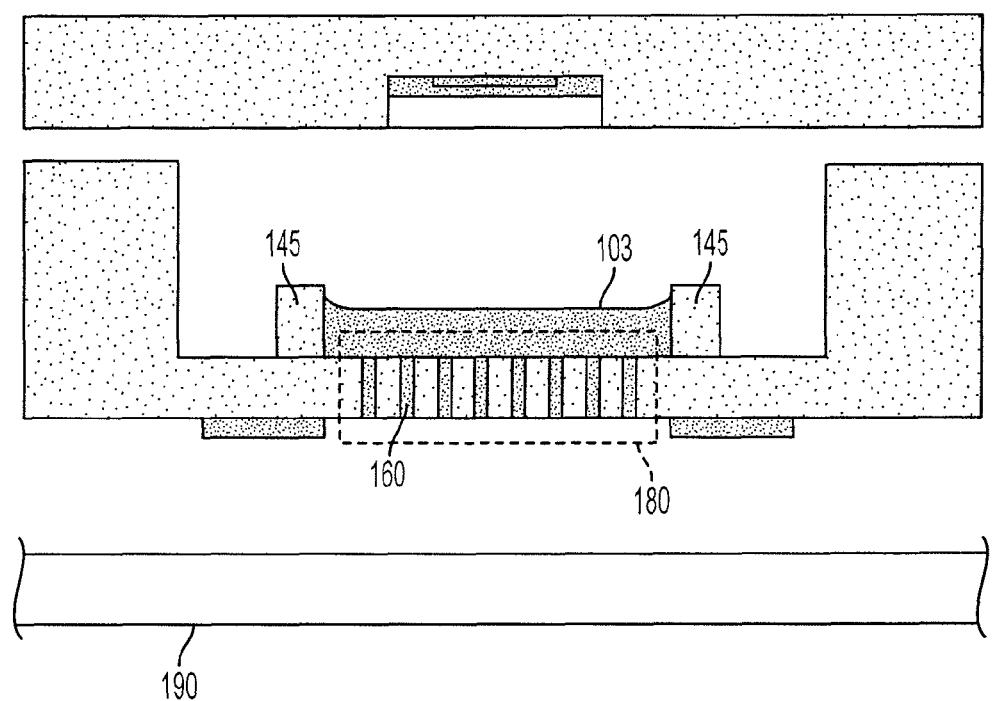

FIGS. 2A-2D schematically show the process of depositing ink on a substrate according to one embodiment of the disclosure. While different films and material can be deposited using the embodiments disclosed herein, in one embodiment, the ink is deposited in substantially solid form. In FIG. 2A, ink 101 is commissioned to chamber 130. Ink 101 can have a conventional composition. In one embodiment, ink 101 is a liquid ink defined by a plurality of particles in a carrier liquid. The carrier liquid can comprise one or more solvents having a vapor pressure such that during the transportation and deposition process the solvent is substantially evaporated and the plurality of particles in the carrier liquid are deposited as solid particles. Thus, the deposited plurality of solid particles are deposited comprise a film on the substrate.

Referring again to FIG. 2A, chamber heater 110 comprises the ink dispensing mechanism and pulsatingly imparts thermal energy into ink 101. The thermal energy drives at least a portion of ink liquid 101 through orifice 170 to form ink droplet 102. Ink droplet 102 can define all of, or a portion of liquid ink 101. The pulsating impartment of energy from an energy source (e.g., heater 110) determines the quantity of ink to be metered out from chamber 130. Once droplet 102 is metered out of chamber 130, it is directed to discharge nozzle 180.

In another exemplary embodiment, piezoelectric elements (not shown) can be positioned at or near chamber 130 to meter out the desired quantity of ink 101 through orifice 170, thereby forming droplet 101. In yet another exemplary embodiment, liquid can be streamed out of chamber 130 through orifice 170 (by, for instance, maintaining a positive ink pressure) and this stream can be pulsatingly interrupted by a mechanical or electrostatic force such that metered droplets created from this stream and further directed onto discharge nozzle 180. If a mechanical force is utilized, this force can be provided by introducing a paddle (not shown) that pulsatingly intersects the stream. If an electrostatic force is utilized, this force can be provided by introducing a capacitor (not shown) around the stream that pulsatingly applies an electromagnetic field across the stream. Thus, any pulsating energy source that activates a dispensing mechanism and thereby meters liquid 102 delivered from chamber 130 through orifice 170 and to discharge nozzle 180 can be utilized. The intensity and the duration of each energy pulse can be defined by a controller (not shown) which is discussed below. Furthermore, as noted above, this metering can occur primarily when the ink is ejected from chamber 130 through orifice 170; alternatively, this metering can occur primarily wile the ink is traveling from orifice 170 to discharge nozzle 180.

As discussed in relation to FIGS. 1A-1E, discharge nozzle 180 includes conduits for receiving and transporting metered droplet 102. Discharge nozzle heater 150 is placed proximal to discharge nozzle 180 to heat the discharge nozzle. In an exemplary embodiment (not shown), a heater is integrated with the discharge nozzle such that partitions 165 define the heating elements.

Discharge nozzle 180 has a proximal surface (alternatively, inlet port) 181 and a distal surface (alternatively, outlet port) 182. Proximal surface 181 and distal surface 182 are separated by a plurality of partitions 160 and conduits 165. Proximal surface 181 faces chamber 130 and distal surface 182 faces substrate 190. Nozzle heater 150 can be activated such that the temperature of discharge nozzle 180 exceeds the ambient temperature which enables rapid evaporation of the carrier liquid from droplet 102 which is now lodged in conduits 160. Nozzle heater 150 may also be activated prior to energizing the ink dispenser (and metering ink droplet 102 as it travels from chamber 130 through orifice 170 to discharge nozzle 180) or after droplet 102 lands on discharge nozzle 180. In other words, chamber heater 110 and discharge heater 150 can be choreographed to pulsate simultaneously or sequentially.

In the next step of the process, liquid ink 103 (previously droplet 102) is directed to inlet port 181 of discharge nozzle 180 between confining walls 145. Liquid ink 103 is then drawn through conduits 160 toward outlet port 182. As discussed, conduits 160 can comprise a plurality of micro-pores. Liquid in ink 103, which may fill conduits 160 extends onto the surrounding surface, with the extent of this extension controlled in part by the engineering of confining walls 145, may evaporate prior to activation of discharge nozzle 180, leaving behind on the micro-pore walls the particles 104 (FIG. 2C) that are substantially solid and which can be deposited onto substrate 190. Alternatively, the carrier liquid in ink 103 (FIG. 2B) may evaporate during activation of nozzle heater 150.

Figure 2C:
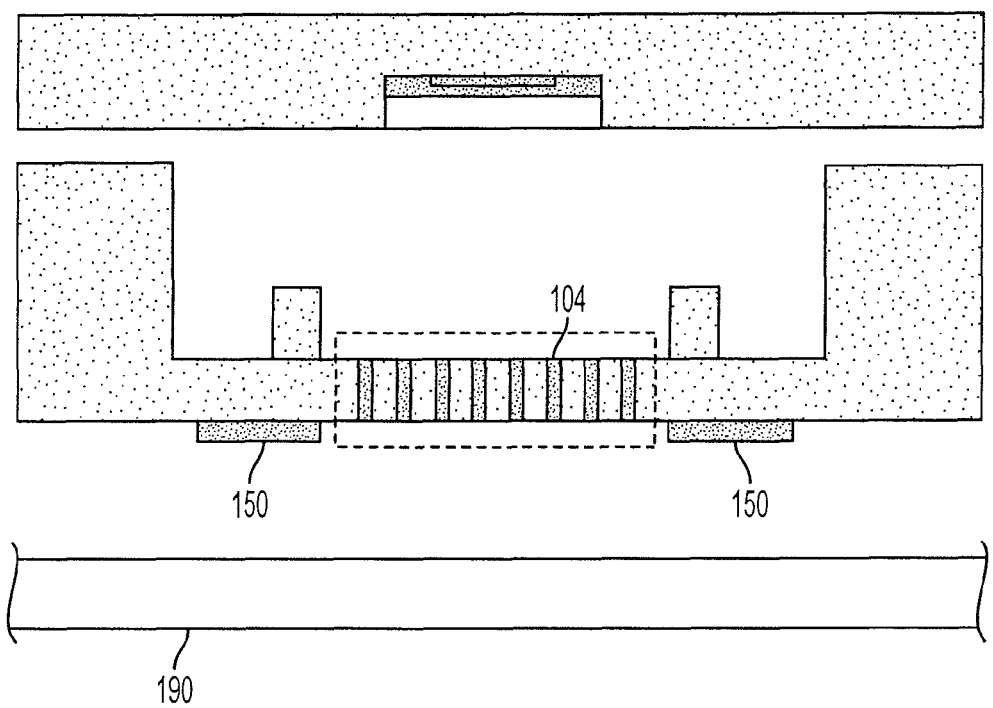
Figure 2D:
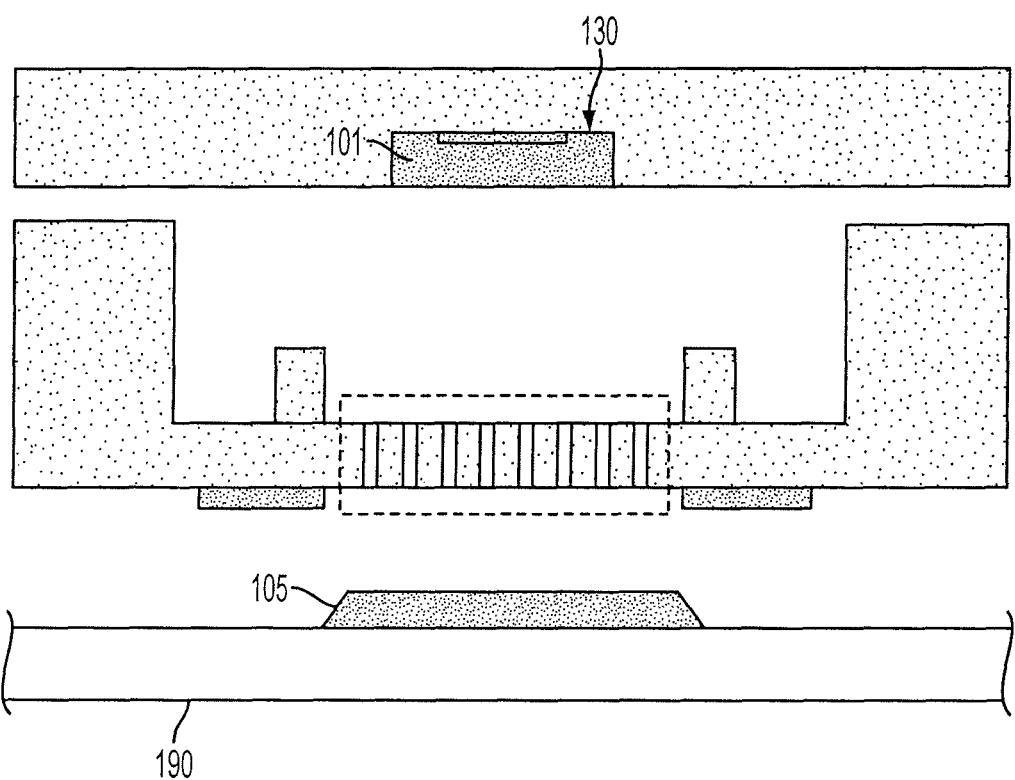

Activating nozzle heater 150 in FIG. 2C, provides pulsating energy to discharge nozzle 180 and dislodges material 104 from conduits 160. The result is shown in FIG. 2D. The intensity and the duration of each energy pulse can be defined by a controller (not shown.) The activating energy can be thermal energy. Alternatively, any energy source directed to discharge nozzle 180 which is capable of energizing discharge nozzle 180 to thereby discharge material 104 from conduits 160 (e.g., mechanical, vibrational, ultrasonic, etc.) can be used. Deposited film 105 is thus deposited in solid form substantially free of the carrier liquid present in ink 101 (FIG. 2A). That is, substantially all of the carrier liquid is evaporated from ink 103 while it travels through discharge nozzle 180. The evaporated carrier liquid, which typically comprises a mixture of one or more solvents, can be transported away from the housing by one or more gas conduits (not shown).

Substrate 190 is positioned proximal to discharge nozzle 180 for receiving the dislodged material to form thin film 105. Simultaneous with steps shown in FIGS. 2B-2D, chamber 130 is provided with a new quantity of liquid ink 101 for the next deposition cycle.

Figure 3A:
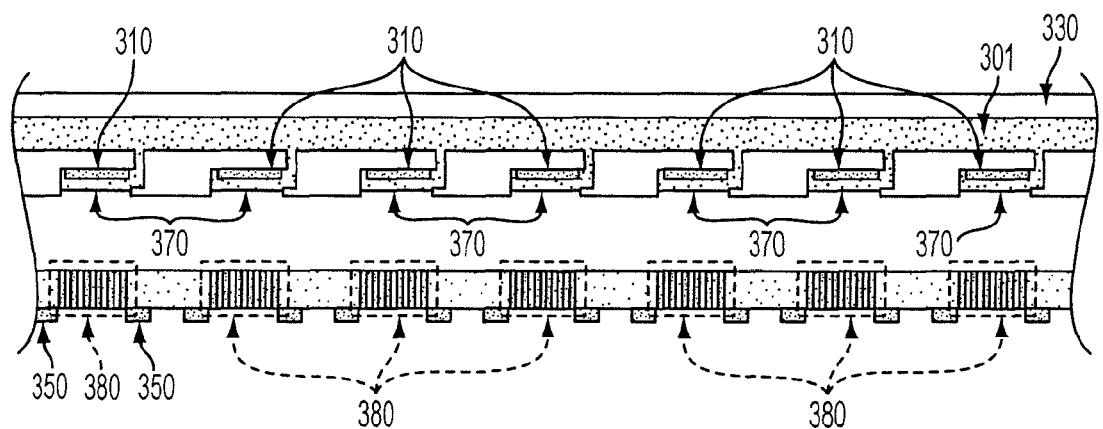
FIG. 3A schematically illustrates a print-head apparatus having multiple discharge nozzles and using thermal ink dispensing elements.

FIG. 3A illustrates a discharge array using a heating element for depositing material. The apparatus of FIG. 3A, includes chamber 330 for housing liquid 301. Liquid 301 can comprise dissolved or suspended particles for deposition on a substrate. Chamber 330 also includes a plurality of chamber orifices 370. The embodiment of FIG. 3A comprises ink dispensing heaters 310 for pulsatingly metering liquid ink through each chamber orifice 370 and towards discharge nozzles 380. Discharge nozzles 380 are arranged in an array such that each discharge nozzle 380 communicates with a corresponding chamber orifice 370. Nozzle heaters 350 are positioned near discharge nozzles 380 to evaporate substantially all of the carrier liquid and to allow solid particles to be deposited by the discharge nozzle array.

Figure 3B:
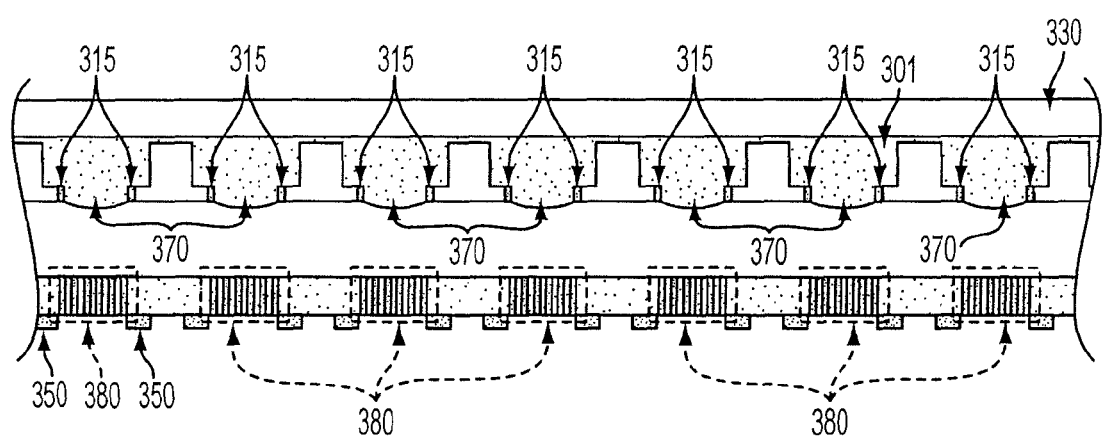
FIG. 3B schematically illustrates a print-head apparatus having multiple discharge nozzles and using piezoelectric ink dispensing elements.

FIG. 3B illustrates a discharge array using a piezoelectric element. Specifically, FIG. 3B shows piezoelectric ink dispensing elements 315 that pulsatingly meter out liquid ink 301 through chamber orifices 370 and toward discharge nozzles 380. In general, any energy source capable of metering the ink can be used. Discharge nozzles 380 are also provided with nozzle heaters 350. While not shown in FIGS. 3A and 3B, liquid ink is delivered to chamber 330 through one or more conduits in fluid communication with an ink reservoir. Additionally, one or more gas conduits (not shown) can be configured to remove any vaporized carrier liquid from the housing. In operation, piezoelectric elements 315 are energized in bursts or pulses. With each pulse of energy, piezoelectric elements vibrate and dispense liquid ink 301 which is held in place through its molecular forces and surface tension. The duration of the pulse energizing piezoelectric elements 370 can determine the quantity of liquid ink 370 which is metered out from each chamber orifice 370. Thus, increasing the amplitude or the duration of, for example, a square pulse, can increase the quantity of the dispensed liquid ink. The viscosity or thixotropic properties of the chosen ink will impact the pulse shape, amplitude and duration for a metered quantity of ink to be delivered from chamber 330 to discharge nozzle 380.

In FIGS. 3A and 3B, discharge nozzles 380 include microporous openings, intervening rigid regions, and heaters 350. The exemplary apparatus may also include a housing configured for operation in a vacuum or a pressurized environment. The housing can further include an inlet port for receiving a transport gas which carries the material from the discharge nozzle 380 to the substrate (not shown). The inlet port can be defined by a flange adapted to receive a transport gas, which according to one embodiment comprises a substantially inert mixture of one or more gases, such as nitrogen or argon. Nitrogen and argon are particularly suitable when depositing conventional organic materials. The transport gas may also transport the ink from the discharge nozzles 380 by flowing through the conduits or the micro-pores. It should be noted that the embodiments shown in FIGS. 3A and 3B define the integration of multiple apparatus, or nozzles (shown in FIGS. 1A and 1B) to form a multi-nozzle deposition system, or a print-head, and that each individual nozzle can include all the features and elements described in reference to the apparatus of FIGS. 1A-1E.

Also, in the embodiments of FIGS. 3A and 3B, the chamber energy sources and discharge nozzles energy sources may be independently and/or simultaneously pulsatingly activated, with the intensity and the duration of each pulse defined by a controller (not shown.) It can be an important consideration when using the deposition apparatus of FIGS. 3A and 3B to utilize multiple simultaneously and independently activated discharge nozzles.

Figure 4:
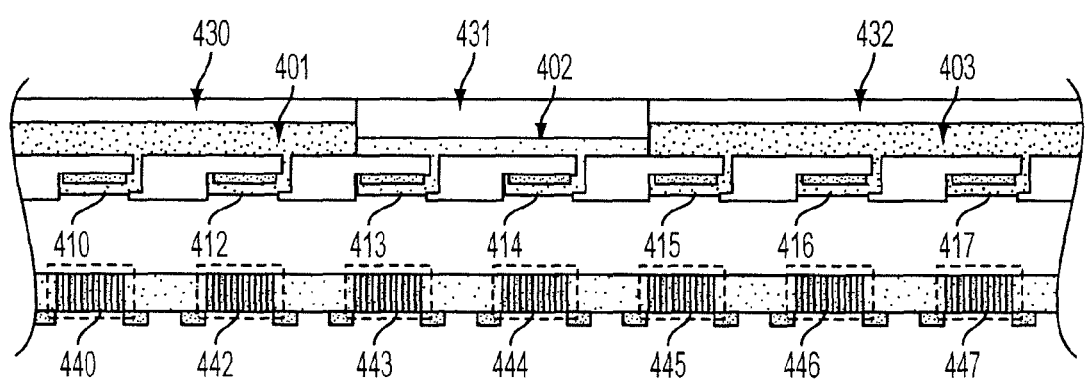
FIG. 4 is a schematic representation of a print-head apparatus with multiple reservoirs.

FIG. 4 is a schematic representation of a print-head apparatus with multiple reservoirs. FIG. 4 includes reservoirs 430, 431 and 423. Each reservoir contains a different deposition liquid. Thus, reservoir 430 contains liquid ink 401, reservoir 431 contains ink 402 and reservoir 432 contains ink 403. In addition, reservoir 401 communicates with chambers 410 and 412, reservoir 402 communicates with chambers 413 and 414, while reservoir 403 communicates with chambers 415, 416 and 417. In this manner, different material can be printed simultaneously using a single print-head. For example, liquids 401, 402 and 403 may contain the OLED materials that determine the emission color, such that liquid 401 may contain the material for fabricating red OLEDs, liquid 402 may contain the material for fabricating green OLEDs, and liquid 403 may contain the material for fabricating blue OLEDs. Each of chambers 410, 412, 413, 414, 415, 416 and 417 communicates with the respective discharge nozzle 440, 442, 443, 444, 445, 446 and 447.

Figure 5:
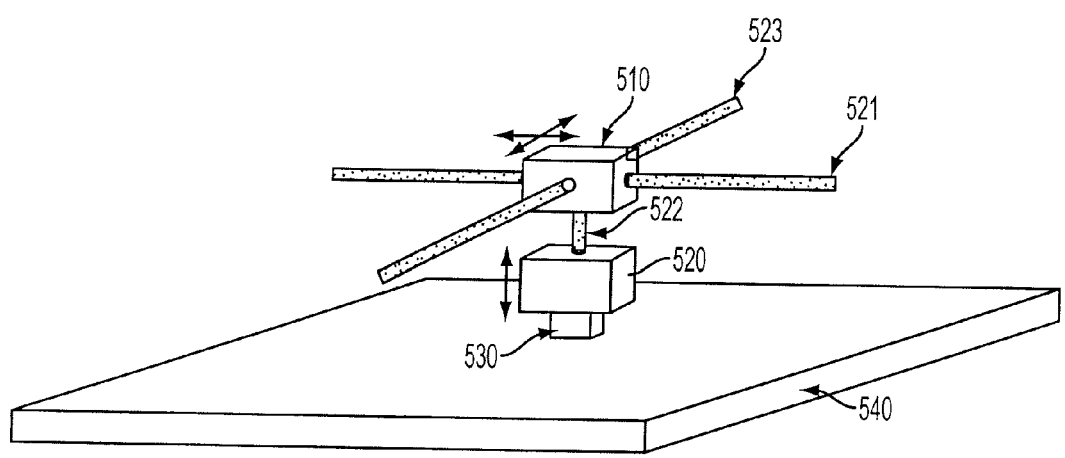
FIG. 5 schematically illustrates an apparatus for depositing thin films of material using one or more print-heads, at least one of which having one or more discharge nozzles, and a positioning system.

FIG. 5 illustrates an apparatus for depositing thin films of material using one or more micro-porous print-heads and a positioning system. Print-head unit 530 may comprise one or more of the apparatuses discussed in relation to FIGS. 1A-1D or permutations thereof as shown in FIGS. 3-4. Print-head unit 530 of FIG. 5 can be connected to positioning system 520, which can adjust the distance between print-head unit 530 and substrate 540 by traveling along guide 522. In one embodiment, print-head unit 530 is rigidly connected to positioning system 520. Print-head unit 530, positioning system 520, and guide 522 can be collectively (and optionally, rigidly) connected to positioning system 510, which can adjust the position of print-head unit 530 relative to substrate 540 in the plane of substrate 540. The position adjustments performed by positioning system 510 may be accomplished by travel along guides 523 and 521. The exemplary apparatus of FIG. 5 may further comprise combinations of multiple independent print-head units and positioning systems (not shown). In the apparatus of FIG. 5, the location of the substrate can be fixed. A related apparatus can be constructed in which the print-head unit position would be fixed and the substrate would move relative to the print-head. Yet another related apparatus can be constructed in which both the print-head unit and substrate move simultaneously and relative to each other.

Including a motion system with the multi-nozzle micro-porous print-head has practical advantages as it provides for high speed printing of arbitrary patterns. The positioning systems utilized in the apparatus of FIG. 5 may control the distance between print head unit 530 and substrate 540 so that the distance is between 1 micron and 1 cm. Other tolerances can be designed without departure form the principles disclosed herein. A control system may actively maintain a constant separation distance, and may utilize optical or capacitive feedback (not shown). The control may also be passive based on prior calibration. The positioning system may also have the capacity to register print-head unit 530 relative to a particular position in the plane of substrate 540 by utilizing optical feedback. The optical feedback may include a digital camera and processing system for converting the digital image into positioning instructions. The positioning system may have an absolute position resolution of between 10 nm and 10 cm for each direction, as appropriate for the application. For instance, for some OLED applications, a positioning resolution of one micron for each direction can be employed.

Figure 6:
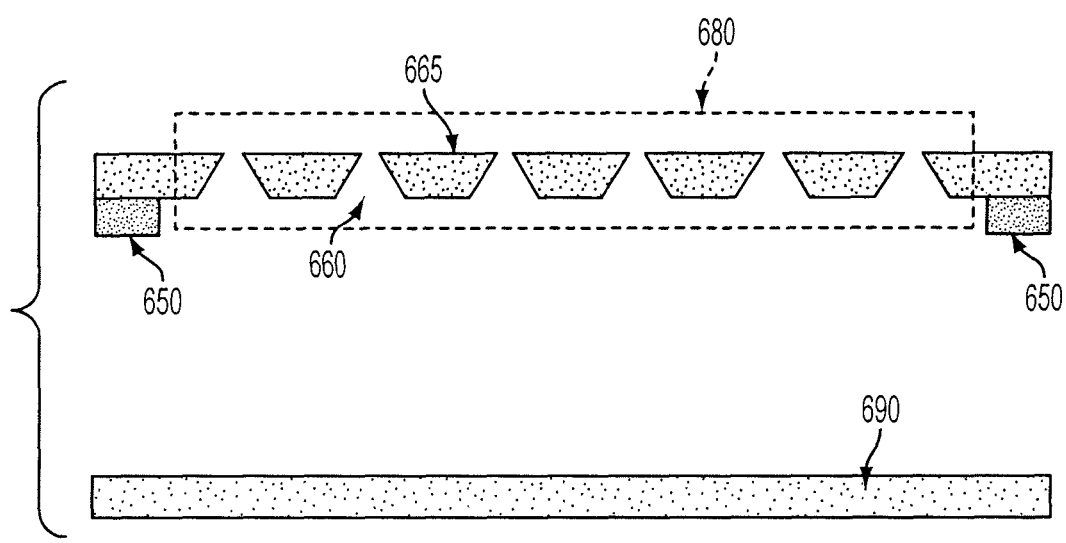
FIG. 6 schematically illustrates a micro-porous discharge nozzle having micro-pores with tapered sidewalls.

FIG. 6 illustrates a micro-porous discharge nozzle having micro-pores with tapered sidewalls. Discharge nozzle 680, intervening rigid segments 665, micro-porous openings 660, and heating elements 650, correspond to elements 180, 165, 160, and 150 of FIG. 1A, except that the sidewalls of micro-pores 660 are tapered. The taper may be engineered so that the wider section of the micro-pore is closer to substrate 690 than the narrower section. The tapered design can be advantageous because upon activation of the discharge nozzle and the subsequent dislodging material, the tapering allows discharge along the direction of the wider section of micro-pores 660. In the exemplary embodiment of FIG. 6, the taper is shown so that activation of discharge nozzle 680 with heating elements 650 can increase the fraction of material that flows to substrate 690 as compared to micro-pores having straight sidewalls. While the sidewalls of FIG. 6 have a substantially straight taper, one can utilize any sidewall profile designed to have a larger opening on one end as compared to the other such that the fraction of material flowing out of the nozzle in one direction or the other is altered. Another example of such a tapered sidewall includes a side that widens monotonically from one end to the other with a curved profile. Yet another profile for rigid segments 665 can be a trapezoidal shape.

Figure 7:
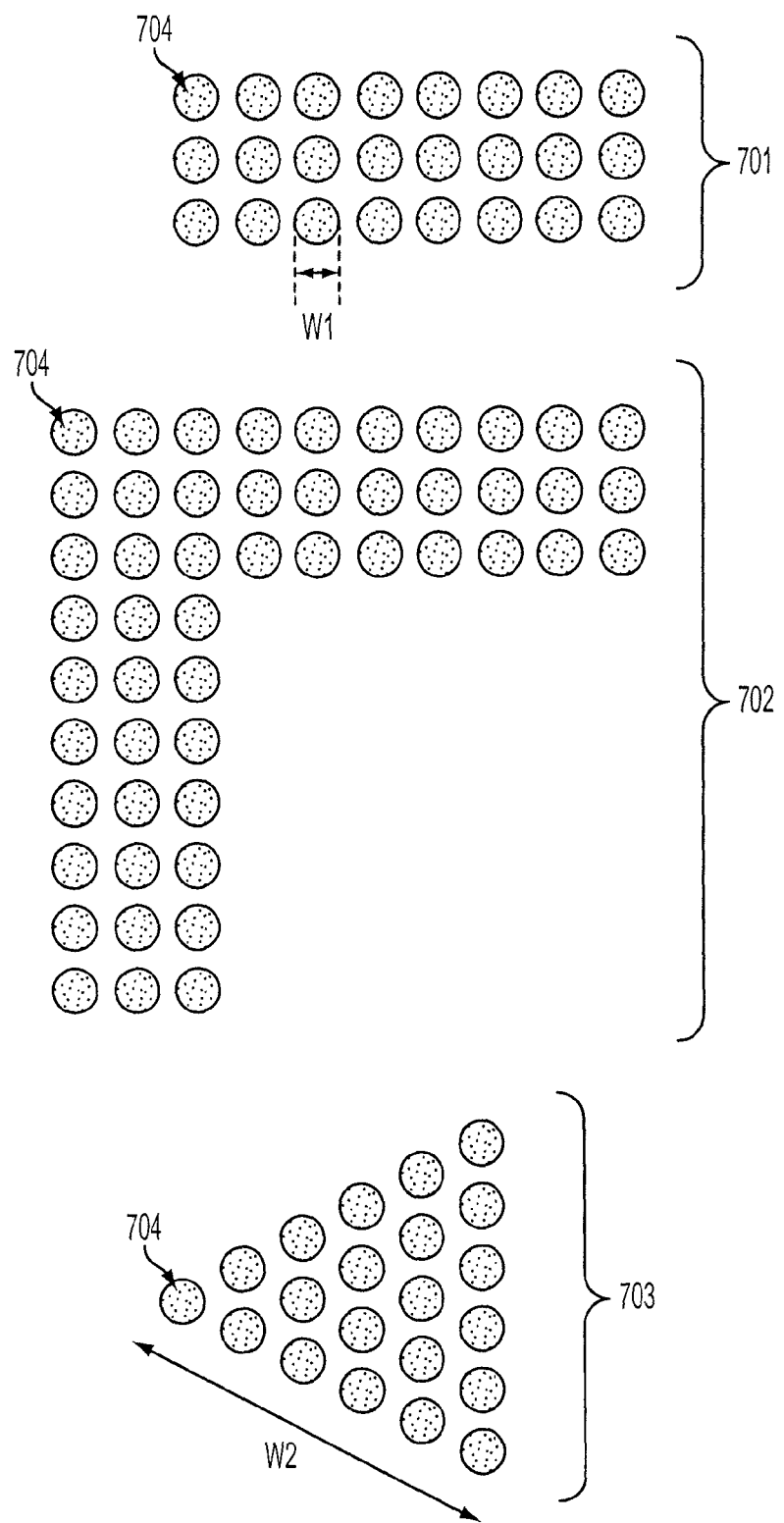
FIG. 7 shows exemplary micro-pore patterns for use in a micro-porous discharge nozzle.

FIG. 7 shows exemplary micro-pore patterns for use in a micro-porous discharge nozzle. Shapes 701, 702, and 703 represent exemplary patterns. Complex pixel shape 701 defines a rectangle, complex pixel shape 702 is defines an L-shape pattern, while complex pixel shape 703 defines a triangle. Other complex pixel shapes, such as ovals, octagons, asymmetric patterns, etc., can also be devised without departing form the principles disclosed herein. Each of the pixel patterns can comprise one or more micro-pores 704. Such pixel patterns are advantageous in depositing a uniform thin film of material with a micro-porous discharge nozzle that covers a region that is not a simple square or circle. Depositing a film using complex micro-pore patterns can be superior to depositing an equivalent region with multiple depositions using a circle or square micro-pore pattern because deposition by this latter method yields a film with a non-uniform thickness where the separate depositions overlap. Additionally, it may not be possible to recreate small features in certain shapes (such as the points of a triangle) except by using an impractically small square or circular micro-pore pattern.

Referring to FIG. 7, each micro-pore 704 can have a width of w1. In an exemplary embodiment, w1 is between 0.1 .mu.m to 100 .mu.m. Each micro-pore pattern can have a width w2 of between 0.5 .mu.m and 1 cm depending on the number, size, and spacing of the micro-pores. The conversion of the complex micro-pore pattern into a corresponding pattern of deposited material on a substrate by the discharge apparatus can depend on the number of micro-pores in the discharge apparatus, the diameter of each micro-pore, the spacing of the micro-pores, the shape of the micro-pore sidewalls, and the distance between the discharge apparatus and the substrate. For example, the discharge apparatus can have complex micro-pore pattern 701, each of the micro-pores can have a diameter (w1) of 1.0 .mu.m, have a center to center spacing of 2.0 microns, and have a straight sidewall. The micro-pores can be positioned about 100 .mu.m from the substrate. It has been found that this approach can be used to recreate an approximately rectangular pattern of deposited material corresponding to complex micro-pore pattern 701.

In one embodiment, a discharge apparatus according to the disclosure can be used to deposit ink in substantially solid form on a substrate. The ink can be composed of the material to be deposited on the substrate in the form of particles initially suspended or dissolved in a carrier liquid. The carrier liquid can be organic, for example, acetone, chloroform, isopropanol, chlorbenzene, and toluene, or can be water. The carrier liquid can also be a mixture of the materials identified above. One or more of the components to be deposited on the substrate can be an organic molecular compound, for example, pentacene, aluminum tris-(8-hydroxyquinoline) (A1Q3), N,N'-diphenyl-N,N'-bis(3-methylphenyl)-(1,1'-biphenyl)-4,4'-diamine (TPD), bathocuproine (BCP), or fac tris (2-phenylpyridine) iridium (Irppy). One or more of the components to be deposited on the substrate may also be polymeric. One or more of the components to be deposited on the substrate may be inorganic, such as a semiconductor or insulator or conductor. One or more of the deposited materials can be an electron injection material. One or more of the deposited materials can be an electron transport material. One or more of the deposited materials can be light emitting material. One or more of the deposited materials can be a hole transport material. One or more of the deposited materials can be a hole injecting material. One or more of the deposited materials can be an exciton blocking material. One or more of the deposited materials can be a light absorbing material. One or more of the deposited materials can be a chemical sensing material. The deposited materials may be used as, for instance, conductors, light emitters, light absorbers, charge blockers, exciton blockers, and insulators, in, for instance, OLEDs, transistors, photodetectors, solar cells, and chemical sensors.

The properties of the ink can define an important factor in depositing the film. One of the important performance criteria for the ink can be the efficient, reliable, and uniform loading of the ink material from the chamber into the discharge nozzles. Relevant performance criteria include the ability of the ink: (1) to wet one or more of the discharge nozzle surfaces; (2) to be drawn rapidly into the discharge nozzle holes; and (3) to spread rapidly over the area of the discharge nozzle containing the discharge nozzle holes. Another important performance criterion for the ink is the consistent delivery of the desired mass of material into the discharge nozzle, so the desired amount of material is consistently deposited each time the discharge nozzle discharges its material. The ink can be adapted so that the ink is reliably delivered from the chamber orifice to the discharge nozzle with a consistent ink volume. These adaptations have been carried out by the inventors for target inks by designing the physical and chemical properties of the ink liquids and the material dissolved or suspended in the ink. These properties include, but are not limited to, viscosity, thixotropy, boiling point, material solubility, surface energy, and vapor pressure.

In one embodiment, the discharge apparatus according to the disclosed embodiments can be used to deposit metal material on a substrate. The deposited metal material can be deposited in substantially solid form. The deposited material can include metal synthesis utilizing organo-metallic precursor materials dissolved or suspended in a solvent, or metal dissolved or suspended in a solvent. The metal dissolved or suspended in a solvent may comprise, at least partially, nanoparticles, which can be coated with organic compounds. The metal can be, for instance, gold, silver, aluminum, magnesium, or copper. The metal can be an alloy or mixture of multiple metals. Such metal material is useful in many applications, for instance, as thin film electrodes, electrical interconnections between electronic circuit elements, and passive absorptive or reflective patterns. Metal films deposited by the discharge apparatus can be used to deposit the electrodes and electrical interconnections utilized in circuits including organic electronic devices such as OLEDs, transistors, photodetectors, solar cells, and chemical sensors. Organo-metallic or metallic material can be delivered to the discharge nozzle, and upon activation of the discharge nozzle can be delivered to the substrate. A reaction converting the organo-metallic material into metallic material can be carried out prior to or during delivery of the liquid from the chamber to the discharge nozzle, during delivery from the discharge nozzle to the substrate, or following deposition on the substrate. When delivering metal material from the discharge nozzle to the substrate, it is advantageous to utilize nanoparticles because this reduces the energy required to dislodge the metal from the micro-pores. Metal deposited on a substrate utilizing the discharge apparatus has the advantage of efficiently utilizing material and employing a deposition technique that may not damage the material onto which the metal film is deposited, including both the underlying substrate and any other deposited layers.

In another embodiment, the discharge apparatus is used to deposit inorganic semiconductor or insulator material in substantially solid form on a substrate. The deposition material can include synthesis utilizing organic and inorganic precursor materials dissolved or suspended in a carrier liquid, or inorganic semiconductor or insulator dissolved or suspended in a carrier liquid. The inorganic semiconductor or insulator dissolved or suspended in a liquid may be comprised of all, or in part, nanoparticles, which can be coated with organic compounds. The inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides. The inorganic semiconductor or insulator can be an alloy or mixture of multiple inorganic compounds. The semiconductor or insulator material can be useful in many applications, for instance, as transparent conductors for electrodes and electrical interconnections between electronic circuit elements, insulating and passivation layers, and as active layers in electronic and optoelectronic devices. When integrated together, these layers can be utilized in circuits containing organic electronic devices such as OLEDs, transistors, photodetectors, solar cells, and chemical sensors.

In another embodiment, precursor or inorganic semiconductor or insulator material can be delivered to the discharge nozzle, and upon activation of the discharge nozzle can be delivered to the substrate. A reaction converting the precursor material into the desired inorganic semiconductor or insulator material can be carried out prior to or during delivery of the liquid from the chamber to the discharge nozzle, during delivery from the discharge nozzle to the substrate, or following deposition on the substrate. When delivering inorganic semiconductor or insulator material from the discharge nozzle to the substrate, it can be advantageous to utilize nanoparticles for reducing energy required to dislodge the material from the micro-pores. Inorganic semiconductor or insulator material deposited on a substrate utilizing the discharge apparatus has the advantage of efficiently utilizing material and employing a deposition technique that may not damage the material onto which the film is deposited, including both the underlying substrate and any other deposited layers.

Figures 8A, 8B:
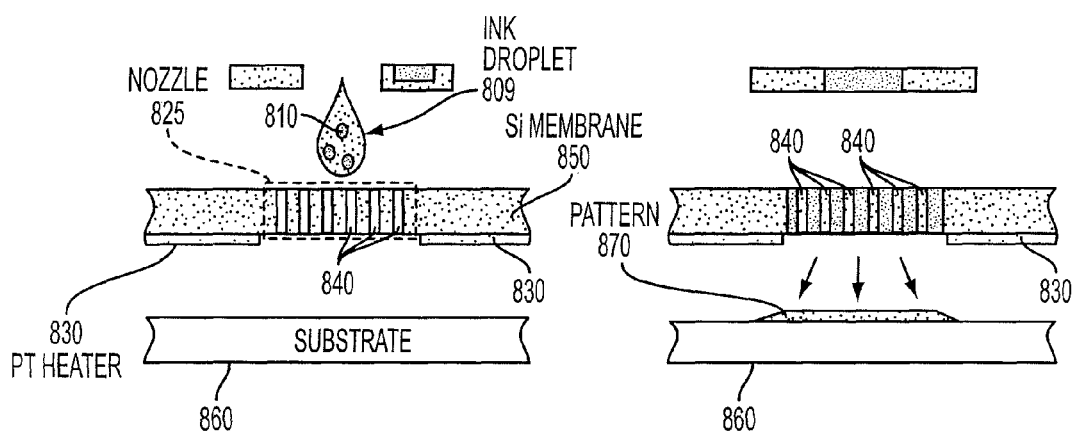
FIGS. 8A and 8B (collectively, FIG. 8) schematically illustrate a dye sublimation printer in accordance with one embodiment of the disclosure.

FIGS. 8A and 8B (collectively, FIG. 8) schematically illustrate a dye sublimation printer in accordance with one embodiment of the disclosure. In FIG. 8A, ink droplet 809 comprises ink pigments dissolved or suspended in a carrier liquid. The carrier liquid can comprise one or more components, including organic solvents and water. Ink droplet 809 is directed to the backside of the discharge apparatus 850. Droplet 809 is drawn into micro-pores 840 where the solvent portion of the liquid ink evaporates, leaving pigment particles 810 deposited on micro pore 840 walls.

Next, and with reference to FIG. 8B, heater 830 can be activated to vaporize pigment particles 810 from micro-pores 840 and discharge the pigment particles from discharge nozzle 825. The discharged pigment particles condense on substrate surface 860, forming pixel pattern 870 of a printed pigment. Heater 830 can also be used to evaporate any remaining solvent in pixel pattern 870.

Figures 9A, 9B:
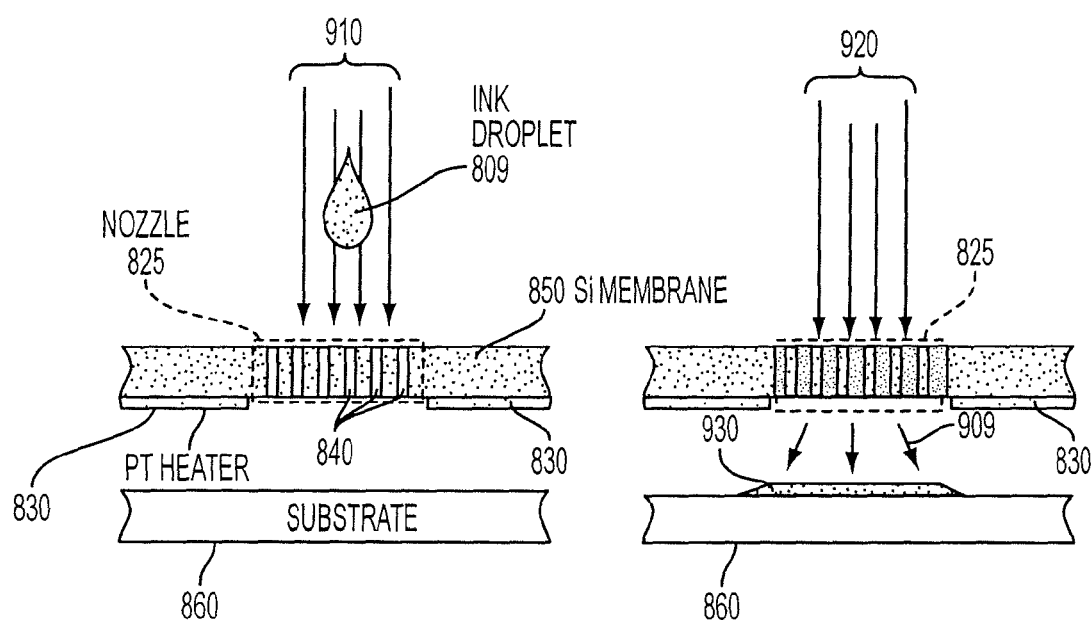
FIGS. 9A and 9B illustrate the use of the discharge apparatus for spatially localized chemical synthesis.

FIGS. 9A and 9B illustrate the use of the discharge apparatus for spatially localized chemical synthesis. In the embodiment of FIG. 9A, reactant gas 910 is flown over discharge nozzle 825. Reactant gas 910 can additionally help vaporize and remove evaporated solvents. The gas flow, along with deposition ink 809, can be drawn into the discharge nozzle micro-pores 840.

In FIG. 9B, vaporizable reactant 920 is directed to discharge nozzle 825 and pressed through micro-pores 840. Vaporizable reactant 920 may optionally contain the suspended particles which form synthesized material 930. Heater 830 can be activated to heat reactant gas flow 909 containing solid ink particles to be deposited. Vaporizable reactant (not shown) from micro-pores 840 can be transported out of the system using an effluent gas (not shown). The heat from heater 830 can then activate the desired chemical reaction to produce the desired material 930 on a substrate 860. In another embodiment, the discharge apparatus 850 can be employed as an efficient, spatially localized heating element, submerged in either a gaseous or liquid environment in which heat from heater 830 is used to activate the chemical syntheses process.

In still another embodiment, an ink having dissolved or suspended particles in a carrier liquid (not shown) is delivered to discharge nozzle 825. Discharge nozzle 825 comprises micro-pores 840 for receiving the ink. After the carrier liquid is evaporated, heater 830 heats the particles deposited on pore walls of the micro-pores 840, where the particles are vaporized and mixed with ambient gaseous and/or liquid environment. In another embodiment the discharge apparatus can be employed as an efficient, spatially localized heating element, in which heat from heater 830 is used to activate the chemical syntheses process on a defined area of the substrate.

Figures 9C, 9D:
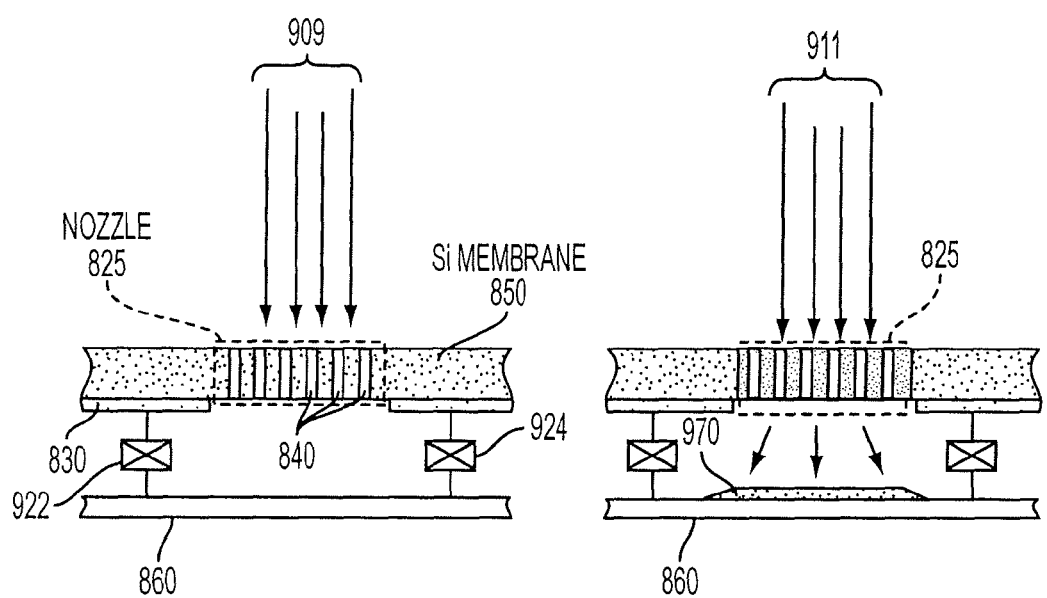
FIGS. 9C and 9D depict the use of a discharge apparatus as a micro reactor.

FIGS. 9C and 9D depict the use of a discharge apparatus as a micro reactor. As shown in FIG. 9C, optional reactant gas flow or ink deposition 909 or vaporizable reactant 911 can be deposited on the backside of the discharge apparatus 850. Discharge apparatus 850 can be integrated into a micro-scale chamber with micro-scale chamber valves 922 and 924 for controlling the in- and out-flux of gaseous and liquid products, reactants, and analytic or synthetic product 970. In FIG. 9C, optional reactant gas flow or ink deposition 909 or vaporizable reactant 911 is drawn into micro-pores 840. Heater 830 is activated to heat optional reactant gas flow or ink deposition 909, or vaporizable reactant 911 from micro-pores 840 and discharge them from discharge nozzle 825. The heat from heater 830 can then activate the desired chemical synthesis process to produce analytic or synthetic product 970 on substrate 860.

In another embodiment, the discharge apparatus can be used to create sub-pixels for displays such as Red, Green, or Blue sub-pixels. Each sub-pixel can have lateral dimensions from 20 .mu.m to 5 mm wide. Other dimensions are available without departing from the principles disclosed herein. The subpixels can include one or more films deposited using one or more of the apparatuses discussed in relation to FIGS. 1A-1D or variations thereof (e.g., as shown in FIGS. 3-4, or in FIGS. 10-11, as discussed further below), referred to here as the "thermal jet" and the corresponding deposition method as the "thermal jet deposition method." A plurality of these sub-pixels can be deposited over a substrate to form one or more displays. When multiple displays are deposited on a substrate, the substrate can be subdivided into individual displays. Deposition using the thermal jet deposition method can be advantageous over shadow masking because shadow masking can require long thin pieces of metal with holes which can twist and bend over large areas and/or which can be difficult to keep clean and/or which generate dust particles.

Figure 10A:
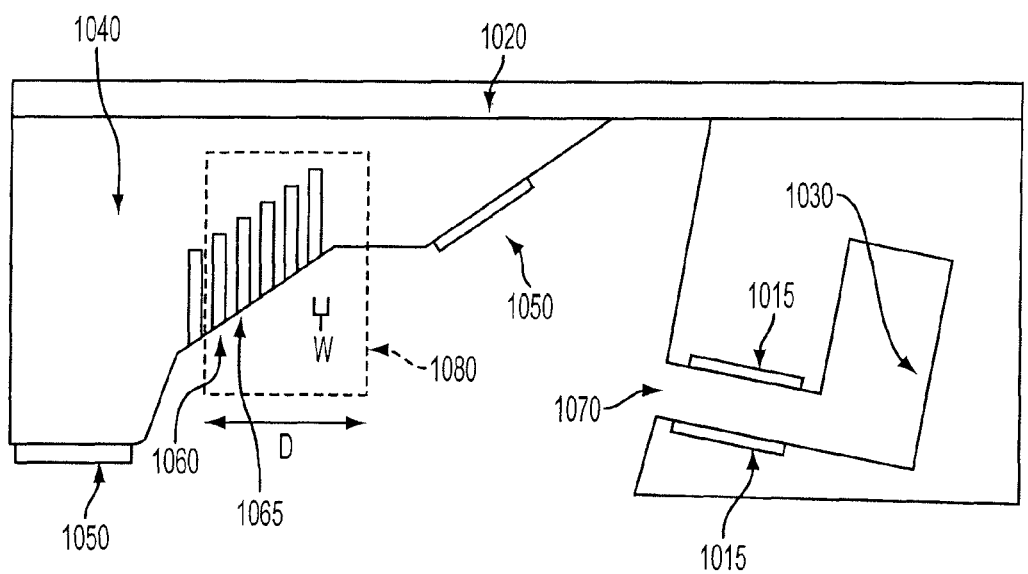
FIG. 10A is a schematic representation of an exemplary print-head in accordance with an embodiment of the disclosure.

FIG. 10A is a schematic representation of an exemplary print-head. Referring to FIG. 10A, the exemplary apparatus for depositing a material on a substrate comprises chamber 1030 for housing ink with containing particles of material to be deposited on a substrate suspended or dissolved in a carrier liquid. Chamber 1030 includes orifice 1070 and a delivery path from orifice 1070 to a discharge nozzle 1080. Discharge nozzle 1080 is defined by a surface that may contain a plurality of micro-porous conduits 1060 for receiving the material communicated through orifice 1070 from chamber 1030. These conduits extend into, but not through, supporting material 1040 which provides mechanical support for the discharge nozzle 1080. Housing 1040 may be joined to the housing for chamber 1030 using bracket or connecting material 1020.

Chamber activator 1015 also includes a piezoelectric actuator 1015 coupled to chamber 1030 for providing pulsating energy to activate the ink dispensing mechanism and thereby meter a droplet of the liquid from chamber 1030 through orifice 1070 towards discharge nozzle 1080. The pulsating energy can be variable on a time scale of one minute or less. For instance, the piezoelectric actuator 1015 can be energized with square pulses having a variable duty cycle and a cycle frequency of 1 kHz. Chamber 1030 may contain material required for forming a film used in the fabrication of an OLED or a transistor. Orifice 1070 is configured such that surface tension of the liquid in chamber 1030 prevents discharge of the liquid prior to activation of the piezoelectric ink dispensing mechanism.

Discharge nozzle 1080 may include rigid portions (interchangeably, partitions) 1065 separated by micro-pores 1060. The micro-pores region can be composed of a variety of materials, such as micro-porous alumina or solid membranes of silicon or silicon carbide and having micro-fabricated pores. In one embodiment, micro-pores 1060 receive the material dissolved or suspended in the liquid and prevent the material from being released again from discharge nozzle 1080 until the medium is appropriately activated. Discharge nozzle 1080 may also comprise a rough surface (not shown) for receiving the material dissolved or suspended in the carrier liquid and delivered from chamber orifice 1070. The surface can similarly contain the material until the discharge nozzle is properly actuated. Alternatively, discharge nozzle 1080 may comprise a smooth surface (not shown) for receiving the material dissolved or suspended in the liquid and delivered from chamber orifice 1070. The smooth surface can be adapted to contain the material until the discharge nozzle is properly actuated. Such adaptations can comprise modification of the surface chemistry or proper selection of the discharge nozzle material with respect to the choice of liquid.

In the exemplary device of FIG. 10A, when the discharged droplet of liquid encounters discharge nozzle 1080, the liquid is drawn into micro-pores 1060 with the assistance of the capillary action. The liquid in the ink may evaporate prior to activation of discharge nozzle 1080, leaving behind a coating of the suspended or dissolved material on the micro-pore walls. The evaporation of the liquid in the ink may be accelerated by heating discharge nozzle 1080. The evaporated liquid can be removed from the chamber and subsequently collected (not shown) by flowing gas over one or more of the discharge nozzle faces.

Depending on the desired application, micro-pores 1060 can provide containers having a maximum cross-sectional distance W of a few nanometers to hundreds of microns. The micro-porous region comprising discharge nozzle 1080 will take a different shape and cover a different area depending on the desired application, with a typical dimension D ranging from a few hundred nanometers to tens of millimeters. If discharge nozzle 1080 is adapted so that the micro-porous region is replaced by a roughened surface region or a smooth surface region (not shown), the discharge nozzle 1080 behaves in substantially the same manner, whereby the material delivered in a liquid from the chamber 1030 to discharged nozzle 1080 is retained on the surface (by surface tension through proper control of surface and material properties) until activation of discharge nozzle 1080. The evaporation of the liquid in the ink may be accelerated by heating the discharge nozzle. Again, the evaporated liquid can be removed from the chamber and subsequently collected (not shown) by flowing gas over one or more of the discharge nozzle faces.

In the exemplary apparatus of FIG. 10A, the relative orientation of the chamber nozzle orifice 1070 and the surface of discharge nozzle 1080 are such that the liquid in chamber 1030 can be delivered directly from the chamber orifice 1070 (for instance, by firing a droplet at a controlled velocity and trajectory out of chamber orifice 1070) onto the discharge nozzle surface. Furthermore, the discharge nozzle surface is also positioned such that when activated, the material delivered to the discharge nozzle surface can flow substantially towards the substrate. In the exemplary embodiment of FIG. 10A, this is accomplished by aligning the discharge nozzle surface to an intermediate angle relative to both the incoming trajectory of the liquid supplied through chamber orifice 1070 and the angle of the substrate, which would be placed below the print-head (shown in FIG. 10B).

Also, in the exemplary embodiment of FIG. 10A, the discharge nozzle is activated by heater 1050 which is positioned proximal to the discharge nozzle 1080. Nozzle heater 1050 may comprise a thin metal film, composed of, for instance, platinum. When activated, nozzle heater 1050 provides pulsating thermal energy to discharge nozzle 1080, which dislodges the material contained within micro-pores 1060 allowing the material to flow out from the discharge nozzle. Dislodging the material may include vaporization of the substantially solid ink particles, either through sublimation or melting and subsequent boiling. In general, one can employ any energy source coupled to the discharge nozzle capable of energizing discharge nozzle 1080 and thereby discharging the material from micro-pores 1060. For example, mechanical (e.g., vibrational) energy may be used.

Figure 10B:
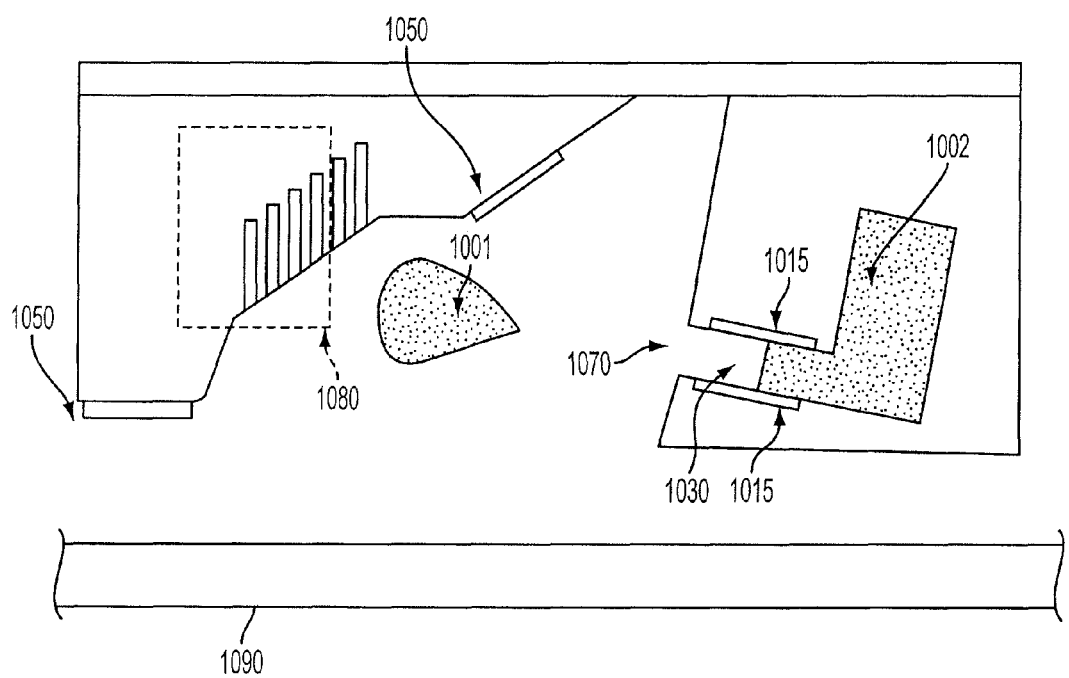
FIGS. 10B-10E illustrate a method for depositing a film using the print-head shown in FIG. 10A.

FIGS. 10B-10E illustrate a method for depositing a film using the print-head shown in FIG. 10A. The method of FIG. 10B is referred to herein as the thermal surface jet deposition method. Referred to FIG. 10B, chamber 1030 is commissioned with ink 1002, comprising particles of material to be deposited on a substrate, dissolved, or suspended in a carrier liquid. Piezoelectric elements 1015 pulsatingly meter liquid 1002 as it travels from chamber 1030 through orifice 1070 to form free droplet 1001. In an alternative embodiment (not shown), a heater is positioned in place of piezoelectric element 1015 for pulsatingly activating a thermal ink dispensing mechanism and thereby driving at least a portion of liquid 1002 in chamber 1030 through orifice 1070 to form free droplet 1001. In general, any pulsating energy source that activates the ink dispensing mechanism to thereby meter liquid 1002 as it travels through orifice 1070 towards discharge nozzle 1080 can be utilized. The intensity and the duration of each energy pulse can be defined by a controller (not shown).

Referring to FIG. 10B, discharge nozzle heater 1050 may be activated so that the discharge nozzle temperature is elevated above ambient temperature. The heating cycle assists in rapidly evaporating the liquid in the ink after it is deposited on the discharge nozzle. Discharge nozzle heater 1050 may also be activated prior to energizing the ink dispensing mechanism (and discharging ink droplet 1001 from chamber 1030 through orifice 1070) or after droplet 1001 lands on discharge nozzle 1080.

Figure 10C:
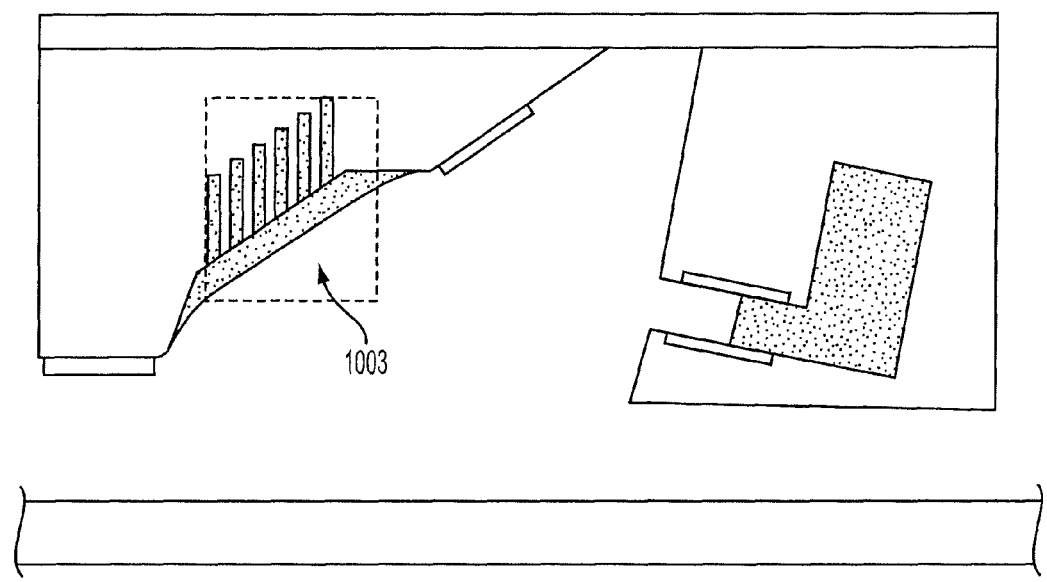
Figure 10D:
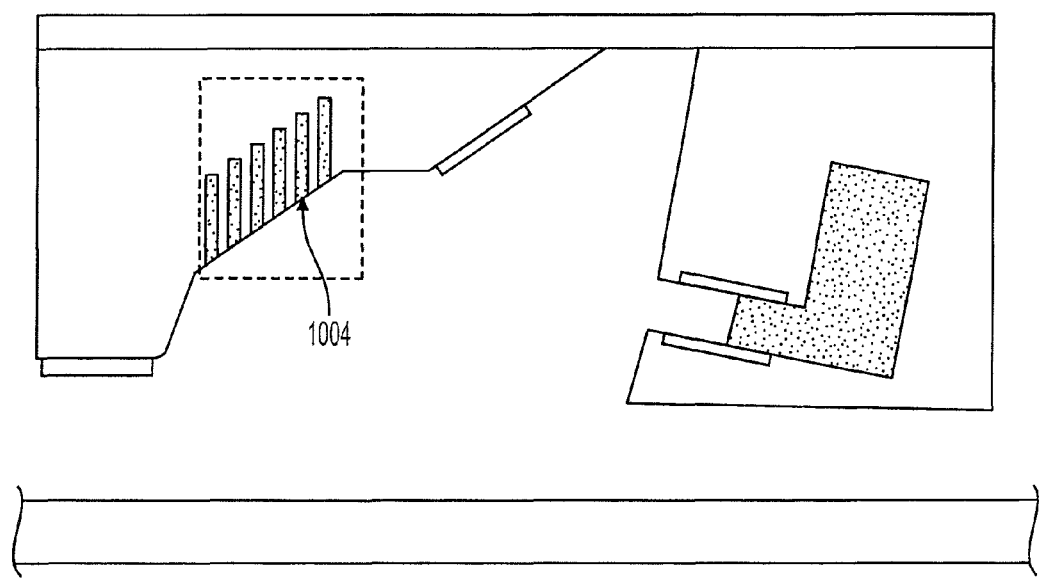

In FIG. 10C, droplet 1001 travels from chamber orifice 1070 to discharge nozzle 1080, where the ink is drawn into micro-pores 1060. The solvent or carrier liquid in ink 1003, which may fill the micro-pores, may evaporate prior to activation of discharge nozzle 1080, leaving behind on the micro-pore walls the material 1004 that is substantially solvent-free and in substantially solid form and which is to be deposited onto the substrate. This is shown in FIG. 10D. Alternatively, the solvent or liquid 1003 may evaporate during activation of discharge nozzle 1080.

Figure 10E:
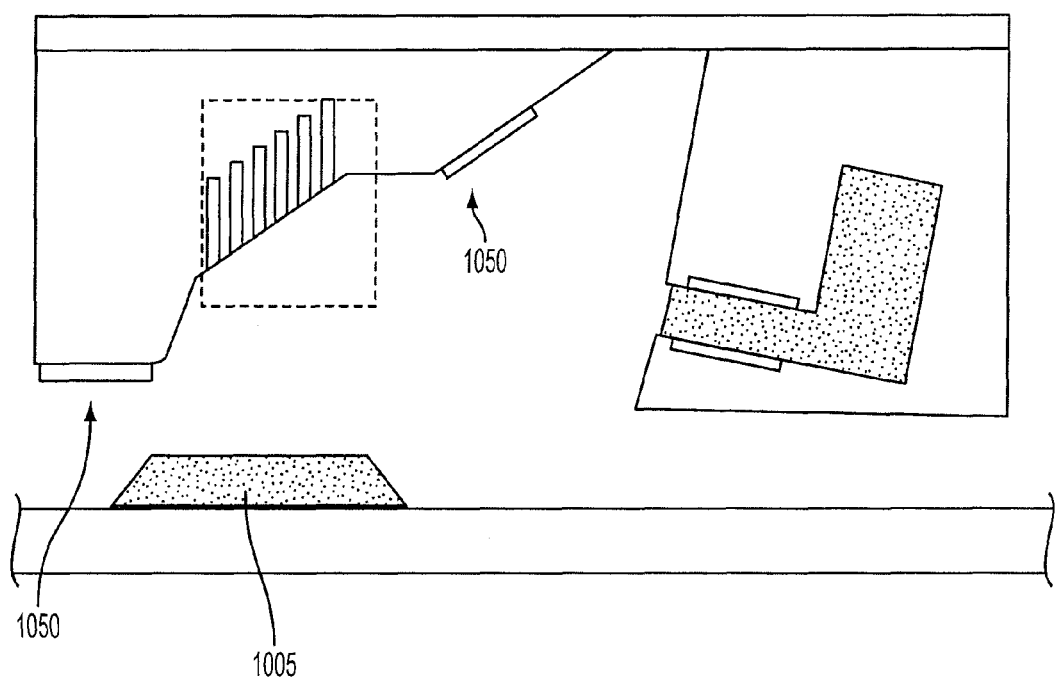

FIG. 10E shows the step of activating nozzle heater 1030 to provide pulsating energy to discharge nozzle 1080 dislodges the material in micro-pores 1060. The intensity and the duration of each pulse can be defined by a controller (not shown). The activating energy can be thermal energy, but alternatively the energy source can be coupled to discharge nozzle 1080 to energize discharge nozzle 1080 and discharge the material from micro-pores 1060. For example, mechanical (e.g., vibrational) energy may also be used for this step. Substrate 1090 can be positioned proximal to discharge nozzle 1080 to receive the dislodged material to thereby form thin film 1005.

Figure 11A:
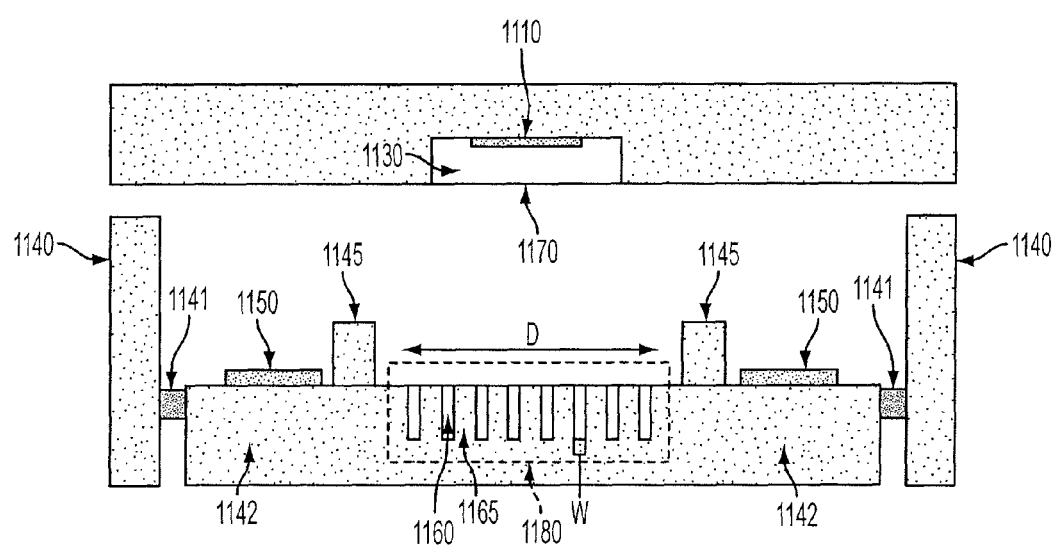
FIG. 11A schematically illustrates a thermally activated print-head according to one embodiment of the disclosure.

FIG. 11A schematically illustrates a thermally activated print-head according to one embodiment of the disclosure. The apparatus shown in FIG. 11A comprises chamber 1130 for housing ink, chamber orifice 1170 and a delivery path from orifice 1170 to a discharge nozzle 1180. Discharge nozzle 1180 includes a surface that containing a plurality of micro-porous conduits 1160 for receiving the liquid ink, containing particles of material to be deposited on a substrate dissolved or suspended in a carrier liquid, communicated through orifice 1170 from chamber 1130. Conduits 1160 extend into, but not through, bracket 1142 which structurally supports discharge nozzle 1180. Bracket 1142 is joined to supporting sidewalls 1140 through rotating joints 1141. Sidewalls 1140 may then be connected to a larger frame to form a housing for chamber 1130 (not shown).

Chamber activator 1110 optionally defines a heater coupled to chamber 1130 for providing pulsating energy which activates the ink dispensing mechanism to meter a droplet of the liquid from within chamber 1130 through orifice 1170 towards discharge nozzle 1180. As stated, pulsating energy can be variable on a time scale of one minute or less.

For example, the actuator 1110 can be energized with square pulses having a variable duty cycle and a cycle frequency of 1 kHz. Chamber 1130 may contain material required for forming a film used in the fabrication of an OLED or transistor. Orifice 1170 can be configured such that surface tension of the liquid in chamber 1130 would prevent liquid discharge prior to activation of the ink dispensing mechanism.

Discharge nozzle 1180 may includes rigid portions (interchangeable, partitions) 1165 separated by micro-pores (or conduits) 1160. The micro-porous region can be composed of a variety of materials, such as micro-porous alumina or solid membranes of silicon or silicon carbide and having microfabricated pores. Micro-pores 1160 receive ink and prevent the material from being released again from discharge nozzle 1180 until the medium is appropriately activated. Discharge nozzle 1180 may also include a rough surface for receiving the material dissolved or suspended in the liquid and delivered from chamber orifice 1170. Such surfaces can retain the material until the discharge nozzle is properly actuated. Alternatively, discharge nozzle 1180 may also contain a smooth surface for receiving the material dissolved or suspended in the liquid and delivered from chamber orifice 1170. Such surfaces can retain the material until the discharge nozzle is properly actuated. It should be noted that such adaptations may require modifying the surface chemistry or selecting appropriate discharge nozzles configuration given the surface chemistry of the liquid.

In FIG. 11A, when the discharged droplet of liquid encounters discharge nozzle 1180, the liquid is drawn into micro-pores 1160 with assistance from capillary action and molecular surface tension. The liquid may evaporate prior to activation of discharge nozzle 1180, leaving behind a substantially solid coating of the suspended or dissolved particles on the micro-pore walls 1160. The evaporation of the liquid in the ink may be accelerated by heating discharge nozzle 1180. The evaporated liquid can be removed from the chamber and subsequently collected (not shown) by flowing gas over one or more of the discharge nozzle surfaces.

Depending on the desired application, micro-pores 1160 can provide containers having a maximum cross-sectional distance W of a few nanometers to hundreds of microns. The micro-porous region comprising discharge nozzle 1180 will take a different shape and cover a different area depending on the desired application, with a typical dimension D ranging from a few hundred nanometers to tens of millimeters. If discharge nozzle 1180 is adapted so that the micro-porous region is replaced by a roughened surface region or a smooth surface region (not shown), the discharge nozzle 1180 behaves in substantially the same manner, whereby the material delivered in a liquid from the chamber 1130 to discharged nozzle 1180 is retained on the surface (by surface tension through proper control of surface and material properties) until activation of discharge nozzle 1180. The liquid may evaporate prior to activation of discharge nozzle 1180, leaving behind a substantially solid coating of the suspended or dissolved material on the discharge nozzle surface. The evaporation process may be accelerated by heating the discharge nozzle. Again, the evaporated liquid can be removed from the chamber and subsequently collected (not shown) by flowing gas over one or more of the discharge nozzle faces.

The relative orientation of the chamber nozzle orifice 1170 and the surface of discharge nozzle 1180 are such that the liquid in chamber 1130 can be delivered directly from the chamber orifice 1170 (for instance, by firing a droplet at a controlled velocity and trajectory through chamber orifice 1170) onto the discharge nozzle surface. Discharge nozzle 1180 can be integrated in 1142 so that it can be rotated relative to side walls 1140 through 1141. The rotation is used to reorient the surface of discharge nozzle 1180 so that when activated, the material delivered to the discharge nozzle surface can flow directly, or at an angle, towards the substrate.

In FIG. 11A, the discharge nozzle can be activated by a heater. The discharge nozzle heater 1150 can be positioned proximal to the discharge nozzle 1180. Nozzle heater 1150 may comprise a thin metal film, composed of, for instance, platinum. When activated, nozzle heater 1150 provides pulsating thermal energy to discharge nozzle 1180, which acts to dislodge the material contained within micro-pores 1160, which can subsequently flow out from the discharge nozzle. Dislodging said material may include vaporization, either through sublimation or melting and subsequent boiling. Any energy source coupled to the discharge nozzle capable of energizing discharge nozzle 1180 to discharge the material from micro-pores 1160 may be used. Confining well 1145 operates in the same manner disclosed in relation to FIG. 1D.

Figure 11B:
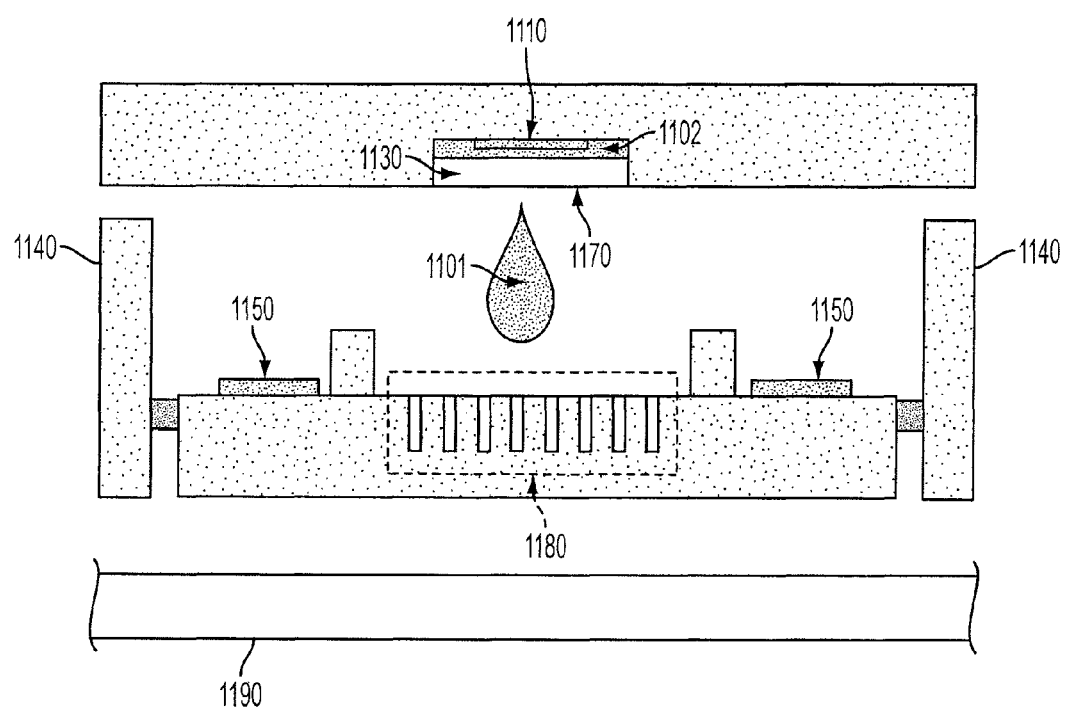
FIG. 11B-11E illustrate a method for depositing a film using the print-head apparatus shown in FIG. 11A.

FIGS. 11B-11E show an exemplary implementation of the print-head apparatus of FIG. 11A. Referring to FIG. 11B, the first step is filing chamber 1130 with ink 1102. The liquid ink may contain material dissolved or suspended in a liquid and can be deposited as a thin film. Chamber heater 1110 pulsatingly introduces thermal energy into the ink 1102 in chamber 1130 and thereby meters at least a portion of liquid 1102 through orifice 1170 to form free droplet 1101. In another exemplary embodiment (not shown), chamber piezoelectric elements 1115 pulsatingly introduce mechanical energy into the ink 1102 in chamber 1130 and thereby meter at least a portion of liquid 1102 through orifice 1170 to form free droplet 1101. The discharge nozzle heater 1150 may be activated so that the discharge nozzle temperature is elevated above ambient temperature. This can assist in rapidly evaporating the liquid in the ink once deposited on the discharge nozzle. The discharge nozzle heater 1150 may also be activated prior to energizing the ink chamber (and discharging ink droplet 1101 from chamber 1130 through orifice 1170) or after droplet 1101 lands on discharge nozzle 1180.

Figure 11C:
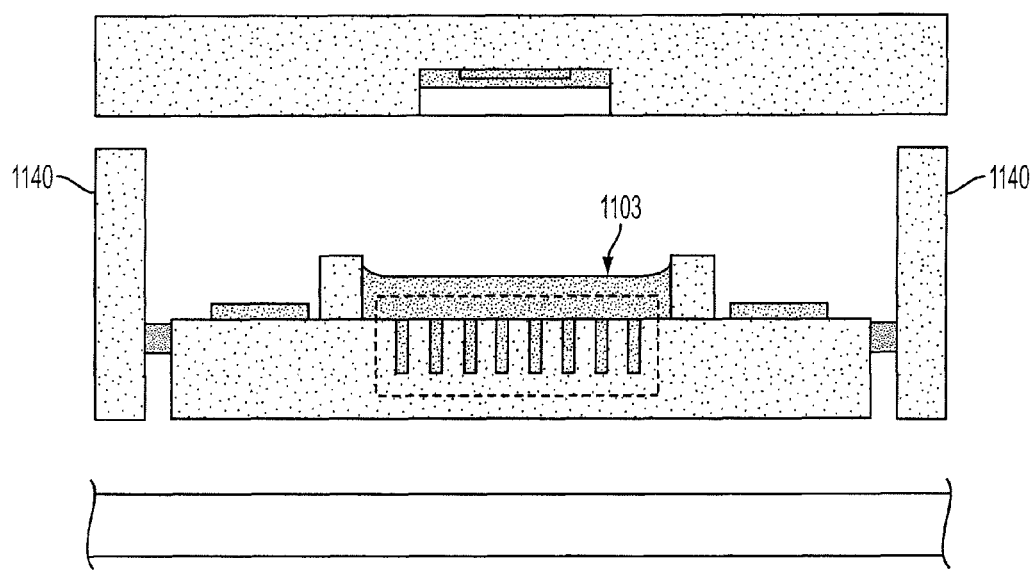
Figure 11D:
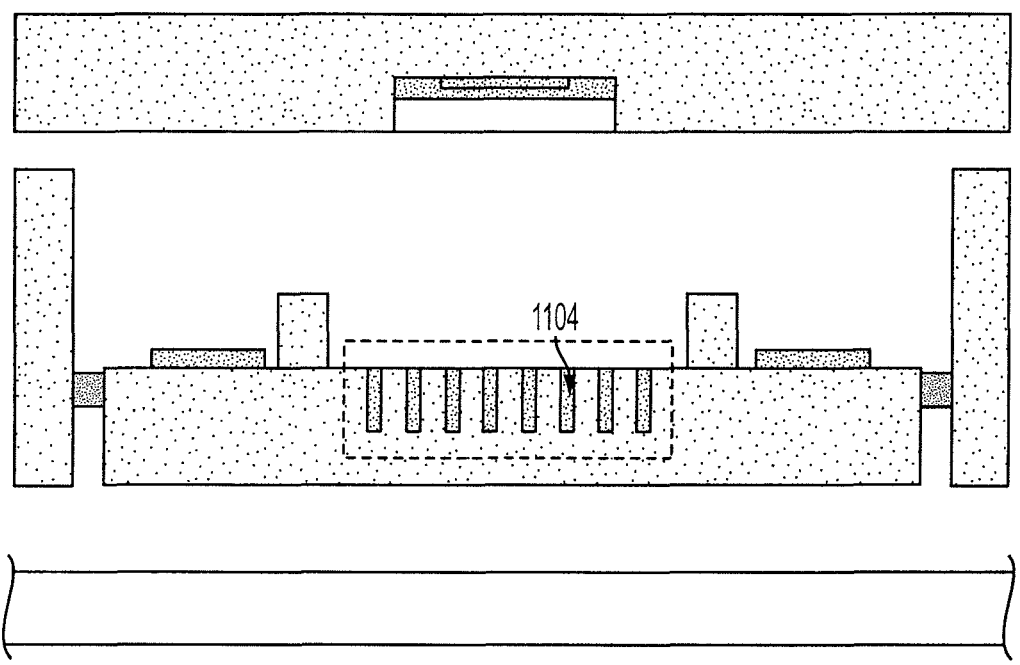

In FIG. 11C, droplet 1101 travels from chamber orifice 1170 to discharge nozzle 1180, where the ink is drawn into micro-pores 1160. Liquid in ink 1103, which may fill the micro-pores and extend onto the surrounding surface, with the extent of this extension controlled in part by the engineering of the surrounding surface, may evaporate prior to activation of discharge nozzle 1180, leaving behind on the micro-pore walls the material 1104 substantially free of solvent. This step of the process is illustrated in FIG. 11D. The solvent in liquid 1103 may also evaporate during activation of discharge nozzle 1180.

Figure 11E:
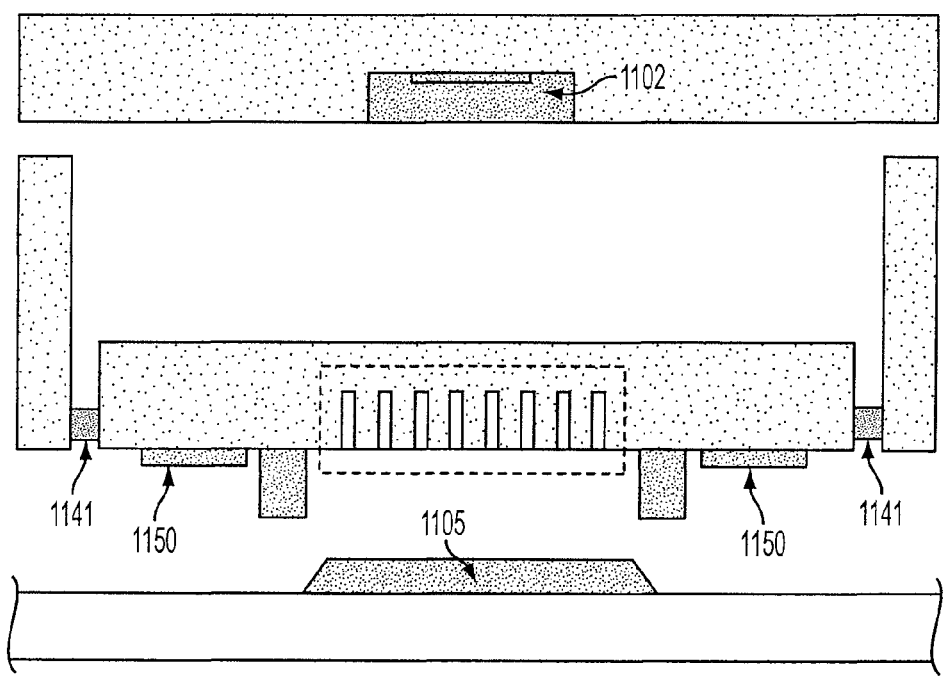

Prior to activating discharge nozzle 1180, the discharge nozzle is rotated 180 degrees relative to sidewalls 1140. As discussed in relation to FIG. 11A, bracket 1142 rotates relative to sidewalls 1140 along joints 1141. This rotation brings the discharge nozzle surface closer to and substantially parallel to substrate 1190, so that there is a direct path from the discharge nozzle surface to the substrate. This step of the process is shown in FIG. 11E. Thereafter, activating nozzle heater 1130 to provide pulsating energy to discharge nozzle 1180 dislodges the material in micro-pores 1160. The intensity and the duration of each pulse can be defined by a controller (not shown). In this exemplary example, the activating energy is thermal energy; one can alternatively employ any energy source coupled to discharge nozzle 1180 that is capable of energizing discharge nozzle 1180 and thereby discharging the material from micro-pores 1160. Substrate 1190 can be positioned proximal to discharge nozzle 1180 to receive the dislodged material and thin film 1105 can be formed.

Figure 12:
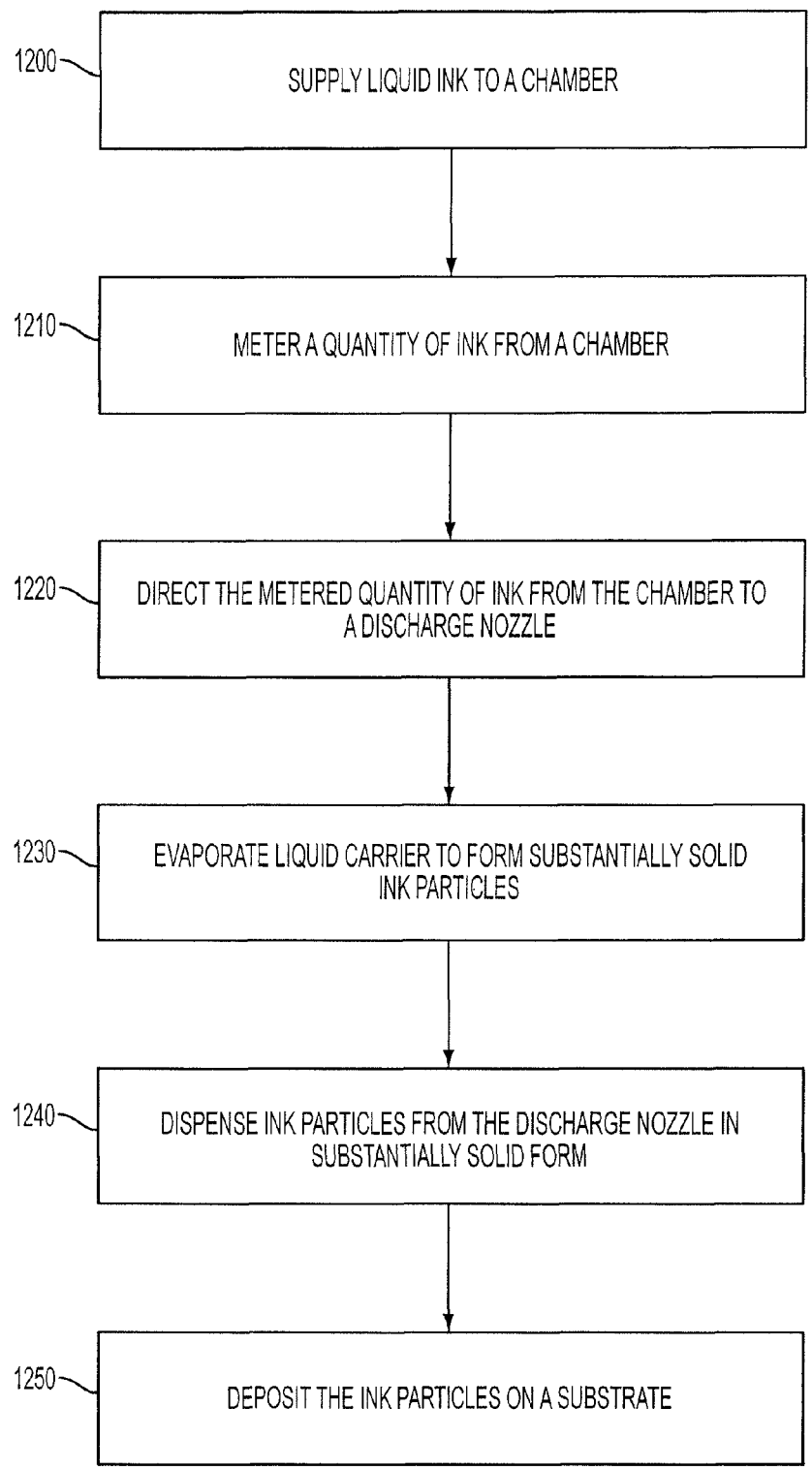
FIG. 12 illustrates a method for depositing particles on a substrate according to one embodiment of the disclosure.

FIG. 12 illustrates a method for depositing particles on a substrate according to one embodiment of the disclosure. Referring to FIG. 12, in step 1200, liquid ink is provided from a reservoir to the chamber of a thermal jet printing device. The liquid ink can be a combination of a liquid carrier and a plurality of ink particles. In step 1210 a desired quantity of liquid ink is metered from the chamber. A dispenser can be used to meter the desired quantity of liquid ink. The dispenser can comprise an electromechanical or vibrational device configured to direct energy to the chamber. In an alternative embodiment, the dispenser comprises a heater. In another embodiment, the dispenser comprises a piezoelectric element. Pulsating energy can be provided to the dispenser to meter the desired quantity of ink. In step 1220, the metered quantity of ink is directed from the chamber to a discharge nozzle. The ink can be directed to the discharge nozzle using gravity feed, forced air conduction or through any conventional means. In step 1230, the liquid carrier is evaporated to leave behind substantially solid particles of ink.

In one embodiment, the evaporation step is implemented as soon as the metered quantity of ink leaves the chamber. In another embodiment, evaporation commences once the liquid ink has reached the discharge nozzle. In still another embodiment, the evaporation step continues until substantially all of the carrier liquid has evaporated. In step 1240, the substantially-solid ink particles are dispensed from the discharge nozzle and deposited on the substrate in step 1250.

Figure 13:
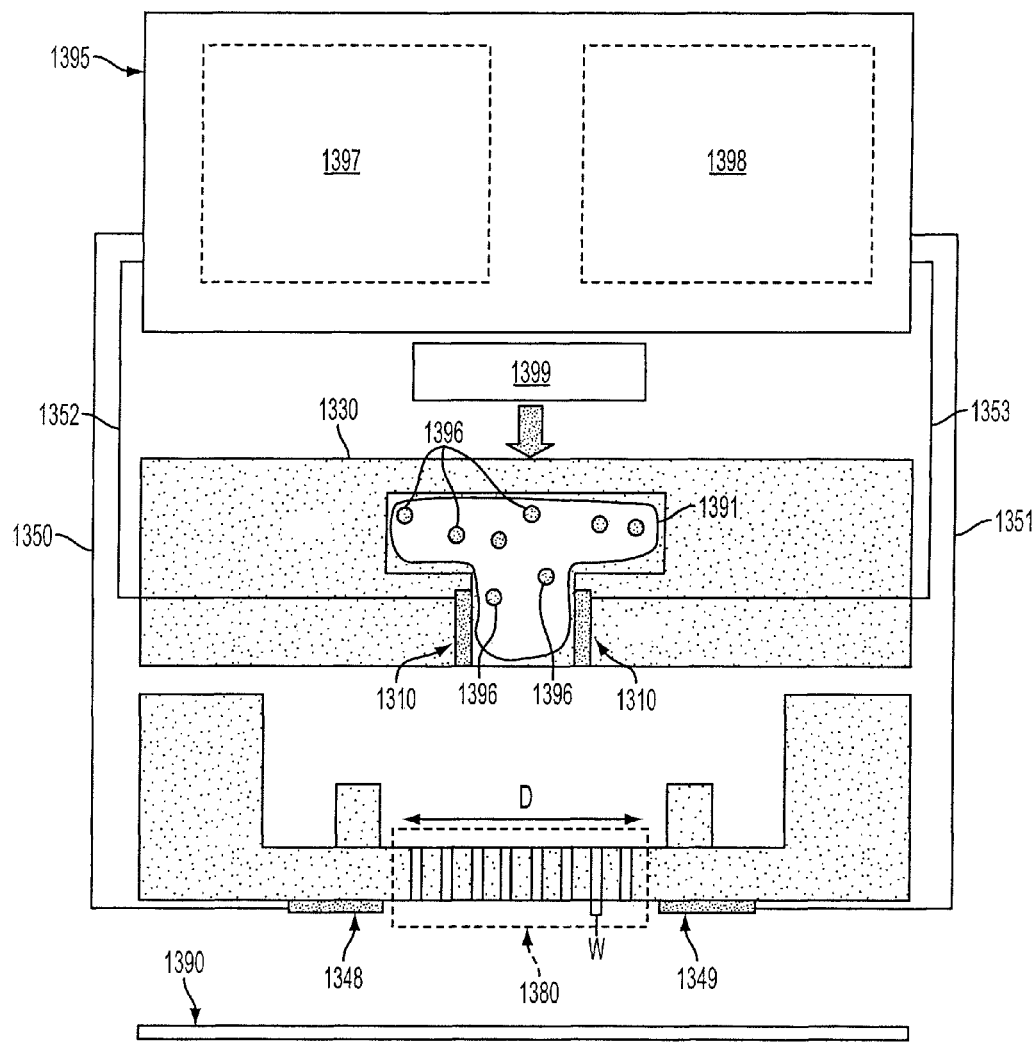
FIG. 13 is a schematic representation of a control system for controlling a print-head having a discharge nozzle, according to one embodiment of the disclosure.

FIG. 13 is a schematic representation of a control system for controlling a dispensing device. In FIG. 13, chamber 1330 is in fluid communication with reservoir 1399. Reservoir 1399 provides liquid ink to chamber 1330. The liquid ink comprises carrier liquid 1391 and dissolved or suspended particles 1396. Dispenser 1310 is positioned proximal to chamber 1330 to agitate the chamber and thereby meter a desired quantity of liquid ink from the chamber. Dispenser 1310 can comprise, among others, a heater. Dispenser 1310 is in electrical communication with controller 1395 through wiring 1353 and 1352.

Controller 1395 comprises processor 1397 and memory 1398. Memory 1398 can contain instructions for directing the processor to activate dispenser 1310 in order to meter an exact quantity of liquid ink from chamber 1330. For example, memory 1398 can comprises a program to pulsatingly activate dispenser 1310 in order to dispense a desired quantity of ink onto discharge nozzle 1380. Controller 1395 may also activate chamber 1330 in order to dispense a desired quantity of ink onto discharge nozzle 1380.

Discharge nozzle 1380 receives the metered quantity of liquid ink from chamber 1330. Heaters 1348 and 1349 are positioned proximal to the discharge nozzle 1380 and configured to heat the metered quantity of ink to thereby evaporate substantially all of the carrier liquid 1391, leaving behind substantially solid ink particles. Heaters 1348 and 1349 can further heat the substantially solid ink particles and thereby boil or sublime the material, so that discharge nozzle 1380 can dispense ink particles 1396 towards substrate 1390. As particles 1396 land on substrate 1390 and condense they form a substantially solid film. Heaters 1348, 1349 are positioned about discharge nozzle 1380 to help evaporate liquid carrier 1391 and dispense solid particles 1396.

In the embodiment of FIG. 13, controller 1395 also controls activation and operation of heaters 1348 and 1349 through electric lines 1350 and 1351, respectively. Memory 1398 can be configured with instructions to direct processor 1397 to engage and disengage heaters 1348 and 1349 to thereby evaporate liquid carrier 1391 and deposit particles 1396 onto substrate 1390.

While the schematic representation of FIG. 13 provides a single controller (i.e., controller 1395), the principles disclosed are not limited thereto. In fact, a plurality of controllers, with each controller having one or more independent processors and memory circuits can be used to accurately control the thermal dispensing system. For example, a first controller (not shown) can be used to control metering liquid ink delivered from chamber 1330 by controlling the pulse parameters supplied to dispenser 1310. A second controller (not shown) can be used to control heaters 1348 and 1349. The second controller can be used to energize the discharge nozzle 1380 to evaporate the carrier liquid. The second controller can receive an input identifying an attribute of the ink. Exemplary attributes of the ink include the ink's viscosity, thixotropic properties, and molecular weight.

While the principles of the disclosure have been illustrated in relation to the exemplary embodiments shown herein, the principles of the disclosure are not limited thereto and include any modification, variation or permutation thereof.

What is claimed is:

1. A method to deposit ink on a substrate, the method comprising:
    providing a quantity of ink to a chamber, the ink having a plurality of suspended particles in a carrier liquid;
    metering at least a portion of the ink delivered from the chamber to an inlet of a discharge nozzle by activating a dispenser to dispense a quantity of metered ink;
    receiving the metered ink at a discharge nozzle, the discharge nozzle having an inlet port and an outlet port;
    transporting the metered ink from the inlet port to the outlet port of the discharge nozzle forming substantially solid particles; and
    depositing the substantially solid particles from the outlet port of the discharge nozzle onto a substrate by energizing the discharge nozzle to pulsatingly eject at least a portion of the substantially solid particles onto the substrate.

2. The method of claim 1, wherein the step of metering at least a portion of the ink further comprises providing a plurality of energy pulses to the dispenser, each energy pulse defined by at least one of an amplitude of the pulse, a duration of the pulse, or a frequency of the pulse.

3. The method of claim 1, wherein the step of metering at least a portion of the ink further comprises providing a plurality of energy pulses to a piezoelectric element associated with the chamber, each energy pulse defined by at least one of amount or duration.

4. The method of claim 1, wherein the inlet port and the outlet port are separated by a plurality of conduits.

5. The method of claim 1, wherein the inlet port and the outlet port are separated by a porous material.

6. The method of claim 1, wherein the inlet port and the outlet port are separated by a plurality of conduits having a tortuous path.

7. The method of claim 1, wherein the inlet port and the outlet port are substantially at the same location.

8. The method of claim 1, further comprising substantially simultaneously evaporating the carrier liquid and transporting the metered ink from the inlet port to the outlet port of the discharge nozzle.

9. A method to provide accurate deposition of ink on a substrate, the method comprising:
    providing a quantity of ink to a chamber, the ink having a plurality of suspended particles in a carrier liquid;

metering at least a portion of the ink delivered from the chamber to an inlet of a discharge nozzle by activating a dispenser to dispense a quantity of metered ink;

receiving the metered ink at a discharge nozzle, the discharge nozzle having an inlet port and an outlet port, the inlet and the outlet port separated by a conduit;

transporting the metered ink from the inlet port to the outlet port of the discharge nozzle forming substantially solid particles; and depositing the substantially solid particles from the outlet port of the discharge nozzle onto a substrate by energizing the discharge nozzle to pulsatingly eject at least a portion of the substantially solid particles onto the substrate.

* * * * *